United States Patent
Sobotka et al.

(10) Patent No.: US 9,116,013 B2
(45) Date of Patent: Aug. 25, 2015

(54) SYSTEM AND METHOD FOR CONTROLLING A CONNECTION OF A METER TO A POWER LINE

(76) Inventors: Peter Sobotka, West Vancouver (CA); Xiao Ming Shi, Burnaby (CA); Yan Long, Burnaby (CA)

(\*) Notice: Subject to any disclaimer, the term of this patent is extended or adjusted under 35 U.S.C. 154(b) by 794 days.

(21) Appl. No.: 13/302,756

(22) Filed: Nov. 22, 2011

(65) Prior Publication Data
US 2012/0126994 A1    May 24, 2012

Related U.S. Application Data

(60) Provisional application No. 61/416,454, filed on Nov. 23, 2010.

(51) Int. Cl.
| | |
|---|---|
| G08B 23/00 | (2006.01) |
| G08C 15/06 | (2006.01) |
| G01R 21/00 | (2006.01) |
| G01R 21/06 | (2006.01) |
| G01D 4/00 | (2006.01) |
| H04B 3/54 | (2006.01) |
| H04L 29/08 | (2006.01) |

(52) U.S. Cl.
CPC ............ G01D 4/002 (2013.01); H04B 3/546 (2013.01); H04L 67/12 (2013.01); G01D 4/004 (2013.01); H04B 2203/5433 (2013.01); Y02B 90/241 (2013.01); Y02B 90/245 (2013.01); Y02B 90/246 (2013.01); Y02B 90/248 (2013.01); Y04S 20/30 (2013.01); Y04S 20/32 (2013.01); Y04S 20/40 (2013.01); Y04S 20/42 (2013.01); Y04S 20/52 (2013.01)

(58) Field of Classification Search
CPC ............. H02H 7/26; G01D 4/04; H04B 3/546
See application file for complete search history.

(56) References Cited

U.S. PATENT DOCUMENTS

| | | | | |
|---|---|---|---|---|
| 4,710,841 | A | * | 12/1987 | Bottrell .................... 361/23 |
| 5,684,450 | A | | 11/1997 | Brown |
| 5,929,750 | A | | 7/1999 | Brown |
| 5,933,071 | A | | 8/1999 | Brown |
| 6,144,292 | A | | 11/2000 | Brown |
| 6,172,597 | B1 | | 1/2001 | Brown |
| 6,282,405 | B1 | | 8/2001 | Brown |
| 7,154,722 | B1 | * | 12/2006 | Stoupis et al. .............. 361/62 |
| 2006/0071776 | A1 | * | 4/2006 | White et al. ................ 340/538 |
| 2009/0006279 | A1 | * | 1/2009 | Buettner et al. ............. 705/412 |
| 2009/0198384 | A1 | * | 8/2009 | Ahn .......................... 700/292 |
| 2009/0222828 | A1 | * | 9/2009 | Lefevre et al. .............. 718/102 |

FOREIGN PATENT DOCUMENTS

WO    WO 2008/030416 A2    3/2008

\* cited by examiner

*Primary Examiner* — Daniell L Negron
*Assistant Examiner* — Mohamed Barakat
(74) *Attorney, Agent, or Firm* — McCarthy Tétrault LLP

(57) ABSTRACT

The disclosure relates to a meter for monitoring usage of power provided by a power transmission system to a site. The meter comprises: a communication module to generate communications carried over the system; a request manager module to process messages received from a head end of the system; a meter module connected to a power feed of the system; a connection manager module to evaluate readings and data and to generate connection signals for the meter in view of the readings; and a relay having a first position where the power is connected to the site and a second position where the power is disconnected, the relay being controlled by the connection signals. The connection manager module generates a first signal for the relay to disconnect the power when an over-voltage condition or an over-current condition on the system has been detected.

17 Claims, 19 Drawing Sheets

Fig. 14
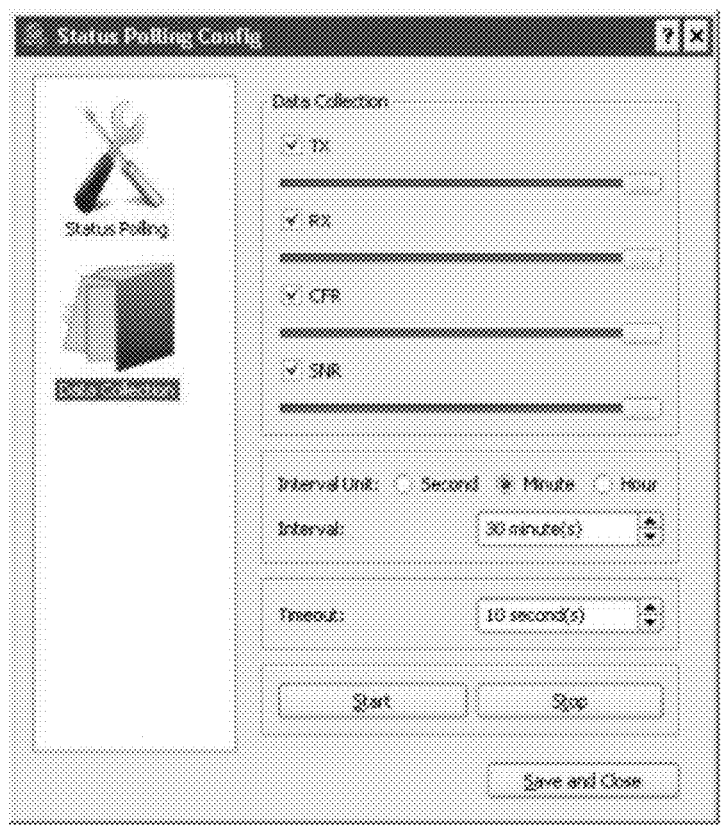
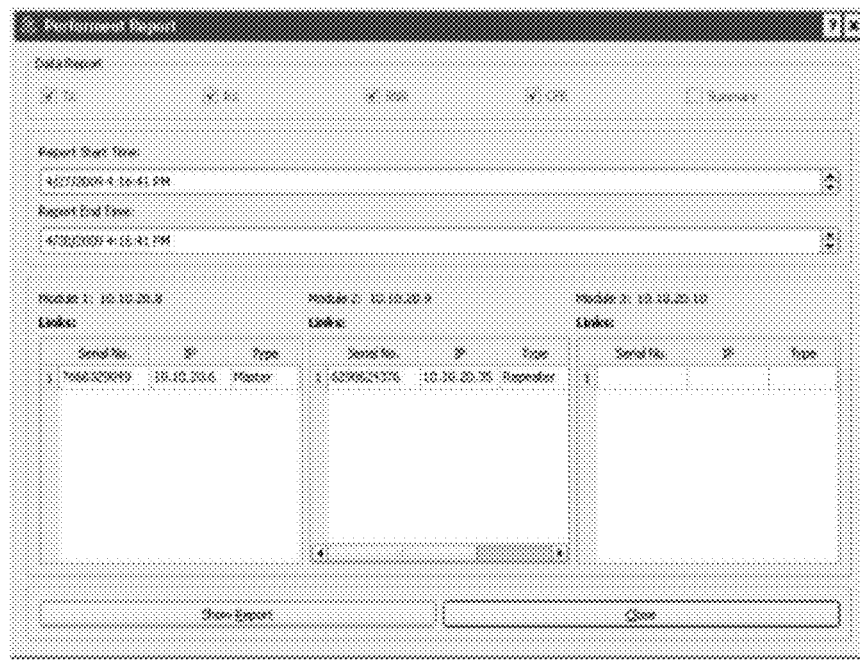
Fig. 15

SYSTEM AND METHOD FOR CONTROLLING A CONNECTION OF A METER TO A POWER LINE

FIELD OF DISCLOSURE

The disclosure described herein relates to a system and method for controlling a connection, such as a power connection, of a meter, such as a utility meter, to a power line.

BACKGROUND

Powerline networks provide energy from a power source (e.g. a hydroelectric dam) to a network of residential and commercial customer sites. The power carried over transmission lines in the network can be distributed through a series of sub-networks to the actual sites. Meters at the sites monitor the power usage, which provides usage data for billing purposes. Some meters provide automated remote transmissions of reading data to a central location, such as a head end of the power network. Such meters have limited capabilities.

SUMMARY OF DISCLOSURE

In a first aspect, a meter for monitoring usage of power provided by a power transmission system to a site is provided. The meter comprises: a communication module to generate communications carried over the power transmission system; a request manager module to process messages received through the communication module from a head end associated with the power transmission system; a meter module connected to a power feed associated with the power transmission system to provide readings relating to the power used at the site; a connection manager module to evaluate the readings and data relating to past power usage at the site and to generate connection signals for the meter to the power transmission system in view of the readings; and a relay having a first position where the power is connected to the site and a second position where the power is disconnected from the site, the relay being controlled by the connection signals. For the meter, the connection manager module generates a first signal for the relay to disconnect the power when an over-voltage condition or an over-current condition on the power transmission system has been detected by or reported to the meter.

In the meter, the over-voltage condition may include a threshold of voltage value over a period of time.

In the meter, the threshold of voltage value may be provided to the meter from a message received through the transmission system.

In the meter, the connection manager module may generate a second signal for the relay to connect the power to the site when a reset condition has been detected by the meter module.

In the meter, the connection manager module may also generate the first signal for the relay to connect the power to the site when a disconnect condition has been detected by the meter module.

In the meter, the relay may further have a third position between the first and the second positions, where for the third position a fraction of available power for the site is provided to the site.

The meter may further comprise an event manager module to evaluate new events queued in a message queue received by the meter.

The meter may further comprise a schedule manager module to schedule obtaining a plurality of readings from the meter module and to provide results of the plurality of readings to the connection manager module.

In the meter, the plurality of readings may be made according to a schedule provided by the schedule manager module.

In the meter, the schedule manager module may update a usage rate for readings made by the meter module a schedule.

In the meter, the request manager module may process a broadcast message received from the head end relating to a cluster command for meters in a subnet that include the meter.

In the meter, the schedule manager module may synchronize a clock of the meter with a system time managed at the head end.

In a second aspect, a method for monitoring usage of power provided by a power transmission system to a site through a meter is provided. The method comprises: obtaining and storing readings for a power feed associated with the site; evaluating the readings and data relating to past power usage at the site; generating connection signals for the meter to the power transmission system in view of the readings; controlling a relay having a first position where the power is connected to the site and a second position where the power is disconnected from the site by the connection signals. In the method, a first connection signal of the connection signals is to disconnect the power when an over-voltage condition or an over-current condition on the power transmission system has been detected by or reported to the meter.

In the method, a second connection signal of the connection signals may be to connect the power to the site is generated when a reset condition has been detected.

In a third aspect, a data transmission system for communicating with meters at remote locations through power transmission lines is provided. The system comprises: a first power network providing power a first voltage level; a server connected to the first network, the server communicating with a plurality of meters in communication with the first network; a second power network connected to the first network and distributing power at a second voltage level to the remote locations, the second voltage level being lower than the first voltage level; and a gateway connecting the first network to the second network, the gateway relaying messages from the first network to a subset of meters in the second network and relaying response messages to the broadcast message from the subset of meters to the server. In the system, the downstream and upstream data communications are encoded in internet protocol (IP) signals in the power transmission network.

In the system, the server may transmit broadcast messages to the first network, where sets of broadcast messages are transmitted in blocks, with one set of messages sent to the second network; and the gateway may receive the one set of messages and may forward it to meters in the second network.

In the system, when the meters in the second network receive one set broadcast messages, the meters may generate and send status messages to the server.

In the system, the server may define a size for the sets of plurality of broadcast messages and the intervals to be within a load index for the server.

In the system, the status messages may include cumulative data stored in memory at the meters.

In the system, the meters may have an interface for a connection to the internet through the power transmission network.

In the system, the server may monitor for responses to the one set of broadcast messages and may retransmit the one set of broadcast message to the second network if the number of responses are below a threshold.

In the system, the server may monitor for responses to the one set of broadcast messages and may transmit individual messages to non-responding meters in the second network if the responses are within a threshold.

In a fourth aspect, a method for communicating from a central location through power transmission lines in a power network with a plurality of meters is provided. The power network comprises a first power network providing power a first voltage level and a second power network connected to the first network. The second network distributes power at a second voltage level to a remote location, where the second voltage level being lower than the first voltage level. The method comprises: from a server associated with the central location, obtaining status updates from the meters by transmitting broadcast messages to the first network destined for delivery to a first set of the meters, where a set of broadcast messages is transmitted in a block of messages, with a portion of the set of broadcast messages sent to meters in the second network; monitoring for responses to the portion of the set of broadcast messages from the meters in the second network; and transmitting a second set of the broadcast messages to the first network destined for delivery to a second set of meters, when the responses to the portion of the set of broadcast messages at least matches a size of the second set. In the method, the first set of meters is less in number than a current load index for a server processing the responses.

In the method, when the meters in the second network receive one set of broadcast messages, the meters may generate and send status messages to the server.

In the method, the current load index may be based on a current time of the server.

In a fifth aspect, a meter for monitoring usage of power provided by a power transmission system to a site is provided. The meter comprises: a meter module connected to a power feed associated with the power transmission system to provide readings relating to the power; a messaging module to provide messages to the power transmission system; a connection to an alternating current (AC) power supply; a rectifier circuit connected to the AC power supply to generate a direct current (DC) power signal; a capacitive circuit connected to an output of the rectifier circuit, the capacitive circuit including a capacitor for storing a voltage for temporarily providing replacement power for the rectifier circuit; and a switching regulator circuit connected to the output of the rectifier circuit and the capacitive circuit, the switching regulator converting the DC voltage signal to a stepped down voltage signal for the meter module.

In the meter, when the AC power supply fails, the capacitive circuit may provide a voltage to the switching regulator through the capacitor and a resistor network.

In the meter, the messaging module may generate and send a message to the power transmission system alerting of failure AC power supply.

In the meter, the meter module maintains an internal clock for synchronization with a clock maintained by a head end.

In the meter, upon re-establishment of the AC power supply, the internal clock may be synchronized to the value of the clock maintained by the head end.

The meter may further comprise: a voltage detection circuit connected to the capacitive circuit to detect a low voltage condition where an output from the capacitive circuit drops below an operational threshold for the meter and to generate a low voltage signal upon detection of the drop; and a message generation module for receiving the low voltage signal and for generating a power loss message for transmission to circuit connected to the capacitive circuit to the power transmission system.

In the meter, the power loss message may be carried on a message carrier having a carrier frequency between approximately 2 MHz and 30 MHz to bridge a discontinuity in the power transmission system.

In the meter, wherein upon detection of the low voltage condition, the meter module may track an unsynchronized time for the meter, where the unsynchronized time beginning at a time associated with detection of the low voltage condition.

Upon a re-boot of the meter, the meter module may compare the unsynchronized time with a clock maintained by a head end.

In a sixth aspect, a method for monitoring usage of power provided by a power transmission system to a site at a meter is provided. The method comprises: charging a capacitive circuit located between a rectifier circuit connected to an AC power supply for the meter that generates a DC power signal for the meter and a switching regulator circuit connected to the output of the rectifier circuit, the switching regulator converting the DC voltage signal to a stepped down voltage signal for the meter module; and when the AC power supply fails, discharging the capacitive circuit to provide a voltage to the switching regulator.

The method may further comprise generating and sending a message to the power transmission system from the meter alerting of failure of the AC power supply.

The method may further comprise: maintaining an internal clock in the meter for synchronization with a clock maintained by a head end; and adjusting the internal clock with the clock maintained by the head end when a discrepancy between the internal clock and the clock maintained by the head end is detected.

The method may further comprise: detecting a low voltage condition where an output from the capacitive circuit drops below an operational threshold for the meter; and generating and sending a power loss message upon detection of the low voltage condition to the power transmission system. In the method, the power loss message may be carried on a message carrier having a carrier frequency between approximately 2 MHz and 30 MHz to bridge a discontinuity in the power transmission system.

In another aspect, a system for communicating with a meter at a remote location through power transmission lines is provided. The system comprises: a head end for collecting and analyzing data from the meter; a power transmission network connected to the meter and to the head end; and a gateway connected to the power transmission network. The power transmission network provides both power to the remote location and data communications to the networks; the power transmission network includes a first network providing a first voltage and a second network connected to the first network and the remote location, the second network providing a second voltage lower than the first voltage to the remote location. The gateway is located at a bridge between first and second networks. The gateway provides an interface communication point for the data communications between the first and second networks; the gateway forwards the data communications between the first and second networks with no effective content-based delay of transmission of the data communications. In the network, the data communications are carried over the power transmission network following internet protocol (IP) communication standards and the gateway adheres to the IP communication standards. The system provides high speed communications as messages are transmitted between the head end and the meter in real time.

In the system, the meter may provide an interface at the remote location for an IP connection to the internet through the power transmission network.

In the system, the meter may obtain power signal measurements relating to signals received from the power transmission network; the meter may send a message containing data relating to the power signal measurements to the head end; the head end may analyze the power signal measurements to the head end to identify a signal to noise ratio (SNR) for the signals received at the meter; and the head end may analyze the SNR to identify operating characteristics of the power transmission network.

The head end may analyze the power signal measurements to the head end to identify a carrier frequency response (CFR) value for the signals received at the meter. The head end may analyze the CFR value to identify operating characteristics of the power transmission network.

In the system, the meter may provide real time data readings from a device at the remote location to the head end.

In the system, the meter may be selectively connected and disconnected from the power transmission network.

In the system, the meter may be disconnected from the power transmission network when any one of the following conditions is detected: an over voltage condition of the power transmission network; an over current condition of the power transmission network; or tampering of the meter.

In the system, meter may comprise a power reserve capacitive circuit to provide residual power to the meter when power from the power transmission network has been interrupted.

In the system, the meter may have an internal clock which is periodically synchronized with a clock maintained by the head end.

In another aspect, a method embodying the features provided above is provided.

In other aspects, various combinations and sub-combinations of the above aspects are provided.

BRIEF DESCRIPTION OF THE DRAWINGS

Embodiments of the disclosure will now be described, by way of example only, with reference to the accompanying drawings, in which:

FIG. 14 is a snapshot of a data collection configuration graphical user interface (GUI) generated on a display of a client associated with the head end of FIG. 3A;

FIG. 15 is a snapshot of a communications link GUI generated on a display of a client associated with the head end of FIG. 3A;

DETAILED DESCRIPTION OF AN EMBODIMENT

Figure 1A:
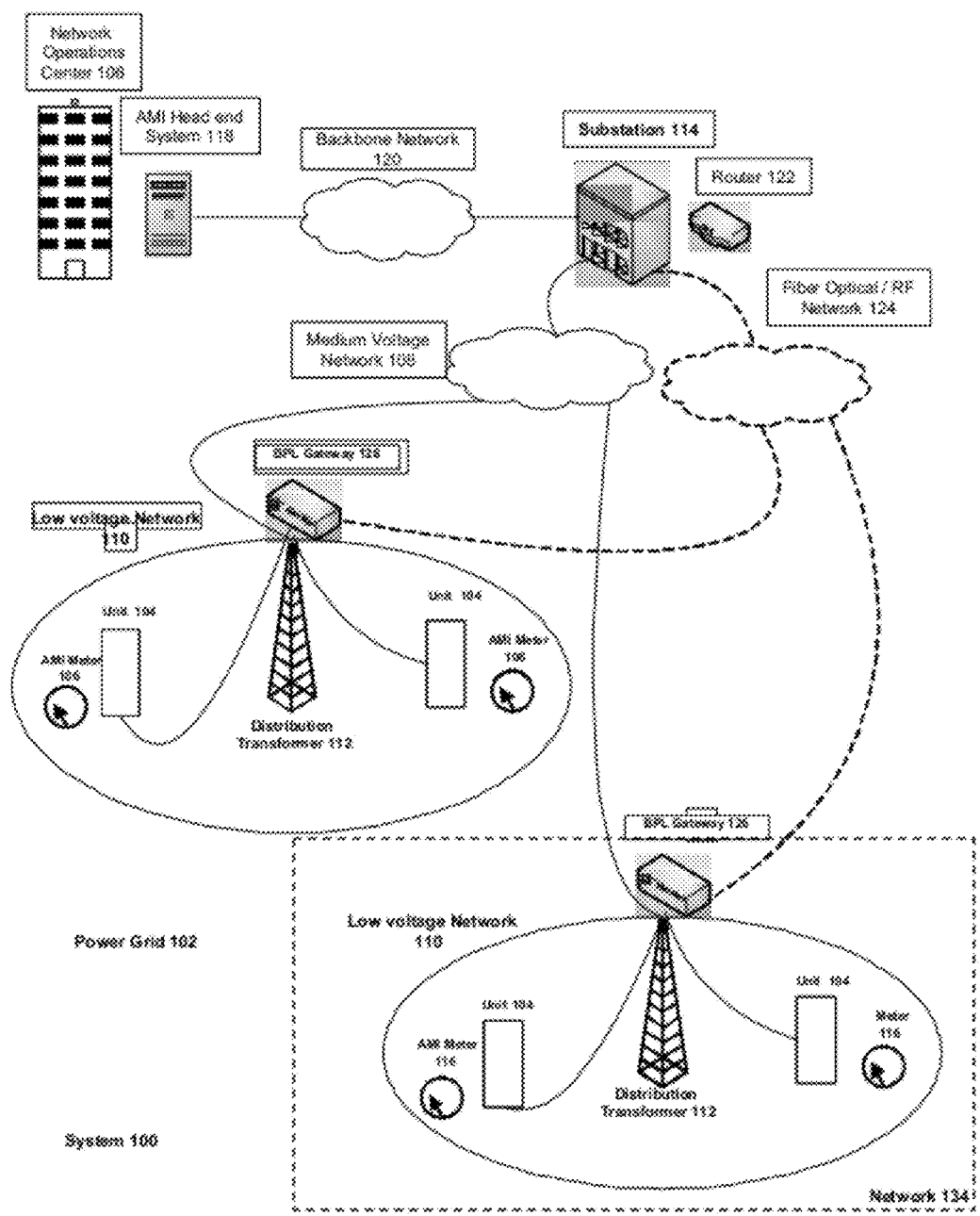
FIG. 1A is an overview of a network implementing an embodiment of the disclosure including a head end communicating with a plurality of meters at end units and a gateway connected between the end units and the head end.

The description which follows and the embodiments described therein are provided by way of illustration of an example or examples of particular embodiments of the principles of the present disclosure. These examples are provided for the purposes of explanation and not limitation of those principles and of the disclosure. In the description which follows, like parts are marked throughout the specification and the drawings with the same respective reference numerals.

Exemplary details of embodiments of the present invention are provided herein.

FIG. 1A illustrates one embodiment of a high speed advanced metering infrastructure ("AMI") system 100. System 100 provides both electricity transmission and data transmission from power grid 102 to units 104. Units 104 are a physical location requiring power, such as a house, an apartment building, an office tower, a shopping mall, a factory, etc. Network operations center 106 is connected to system 100 and provides administrative and network management functions for system 100.

From an electrical transmission point of view, power distribution system includes medium voltage ("MV") network 108 and low voltage ("LV") network 110. Power cables of medium voltage network 108 are MV lines and power cables of LV network 110 are the LV lines. Voltages carried by MV network 108 range from about 600 volts (V) to about 50 kV and voltages carried by LV network 100 range from about 100 V to about 600 V. Distribution transformers 112 are located at nodes between MV networks and a set of end units 104. Transformers 112 convert voltages from MV network 108 from MV values to LV values. Distribution transformers 112 have a primary side connected to a first voltage (e.g., MV network 108) and a secondary side for providing an output voltage. In one embodiment, the secondary output provides a lower voltage (e.g., LV network 110). Distribution transformers 112 provide voltage conversion for power distribution system to units 104. Thus, power is carried from substation 114 to distribution transformer 112 over one or more MV power lines. Power is carried from distribution transformer 112 to its units 104 via one or more LV power lines. Units 104 are located at any premises requiring electricity, including, without limitation, residential homes, businesses, and industrial complexes. Power is provided at household voltage and current rates. In North American power is provided at 120 volts (V). At each end unit 104, meter 116 is provided, which monitors power usage in network 100 by an end unit 104.

In addition, distribution transformer 112 may function to distribute one, two, three, or multi-phase voltages to units 104, depending upon the demands of the users. Distribution transformer 112 may be a pole-top transformer located on a utility pole, a pad-mounted transformer located on the ground, or a transformer located under ground level.

This embodiment of system 100 also provides data communications over powerlines (such as through networks 108 and 110) through broadband over powerline ("BPL") technology through network 134. For system 100, transmission of data is provided over networks 108 and 110 between head end 118 and meters 116. Additional data communications elements include backbone network 120, router 122, fiber optic/radio frequency ("RF") network 124 and BPL gateways 126. Head end 118 is located at a utility network operations center ("NOC"), and router 122 is located in substation 114. BPL gateways 126 are located at distribution transformers 112. In this embodiment, data transmission network between substation 114 and distribution transformers 112 is through MV network 108 or fiber optical/RF network 124. Various transmission/data communication technologies may be used to carry data for backbone network 120, including, without limitation, fiber optics, cable, plain old telephone system (POTS), and other technology known to person skilled in the art. MV network 108 provides one data network backbone to support AMI system 100 through LV network 110. In the portion of system 100 that is formed in LV network 110, network 110 has an uplink port connecting to transformer 112; this uplink port in one embodiment is an Ethernet port running TCP/IP protocol. This port can be connected with various types of backhaul connections, including connections to MV network 108, fiber optical network 124, a wireless communication network, a GPRS network, etc. As shown in FIG. 1A, MV network 108 provides one backhaul network implementation. If a network implementation utilizes a different backhaul network, such as fiber network 124 instead network 108, then the implementation may dispense with having MV powerline network 108 as a backhaul for network 110. System 100 provides data throughput rates in the order of approximately 40 Mbps on the physical layer for the network.

Figure 1B:
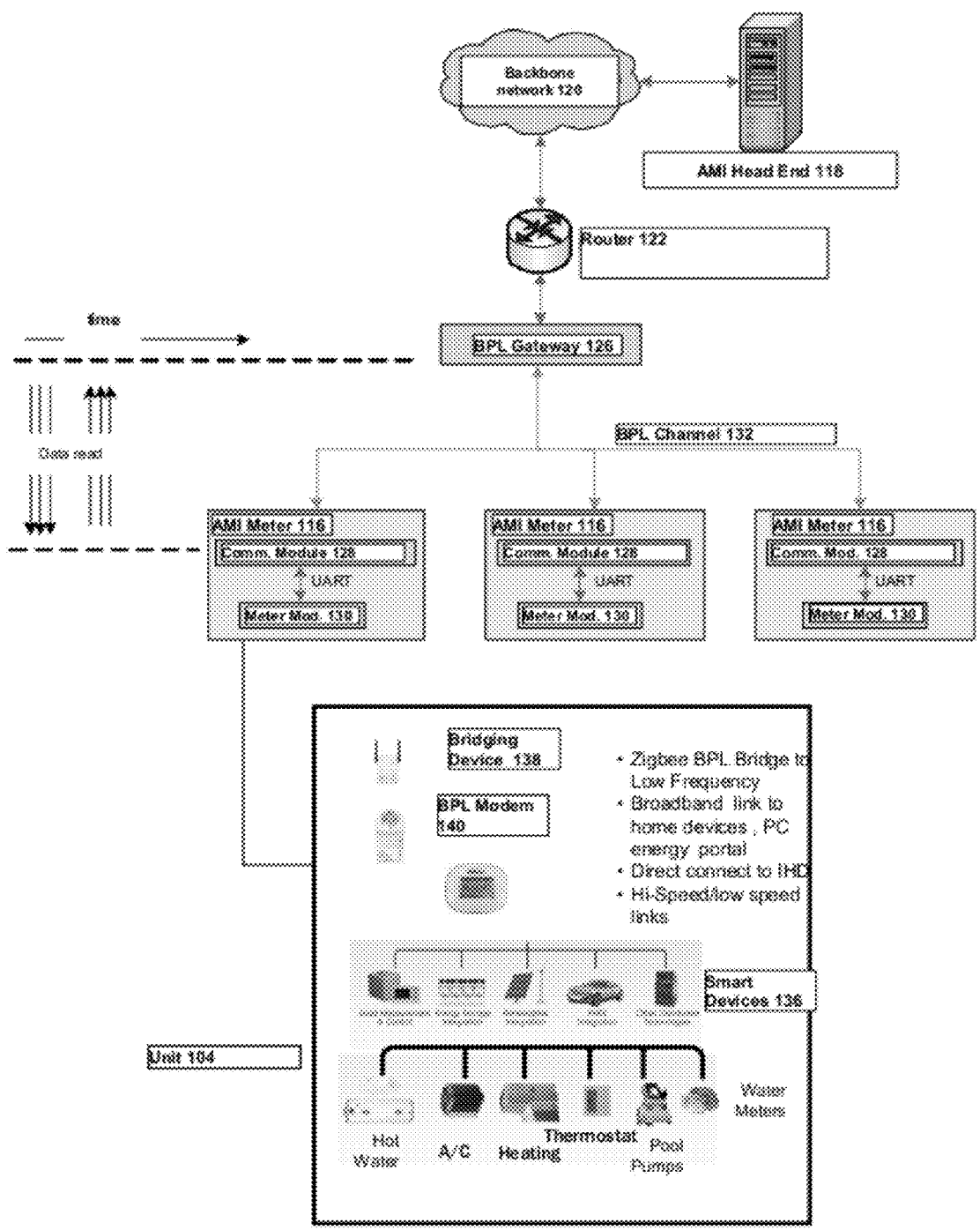
FIG. 1B is an overview of data communication elements of the network of FIG. 1A.

FIG. 1B provides additional detail on communication network 134 of FIG. 1A.

Head end 118 further comprises a server and a head end client 204 (FIG. 2). Head end 118 collects data from meters 116 at units 104, analyzes data and other network operating conditions (both for networks 108 and 110) and provides commands and instructions to meters 116, based on the analysis or predetermined scripts. Meters 116 collect telemetric data from their respective units 104 (such as power usage data, broadband communication network data, device status information, etc.) and provide the data to head end 118, through network 134. Each meter 116 comprises a communication module 128 and a meter module 130. Communication module 128 provides data communications, data analysis and other features for enabling communications between meter 116 and head end 118. Meter module 130 analyzes source data detected from sensors connected to meter 116. Such sensors include an electricity usage monitoring meter and any other device providing trackable data on events occurring at unit 104. Communication module 128 receives and processes data from meter module 130 and provides related communication data to head end 118. For example, in one configuration, when communication module 128 has detected a meter event at meter module 130 and needs to report to head end 118, communication module 128 first constructs an IP packet message with head end 118 as the destination.

Through network 134, instead of head end 118 communicating directly with each meter 116, BPL gateways 126 are provided to manage communications between head end 118 and a set of meters 116. As such, network 134 is organized in a tree configuration with head end 118 at the root, gateways 126 at a first level underneath the root. Router 122 acts a network connecting device for network 134 and/or MV network 108 and interchanges data packets between them. The data packets contain address information used by router 122 to determine if the source and destination are on the same network, or if the data packet must be transferred from one network to another. In one embodiment, gateway 126 is located at LV electricity transformer 114. BPL gateway 126 and related meters 116 belonging to the same LV cell form a communication network 134 in a tree topology. BPL gateway 126 is the root of the tree. The BPL gateway 126 manages the LV network 110 in a medium access control ("MAC") layer based on time division multiple access/time division duplex and parent-child concept. In one embodiment, each LV cell may comprise of up to 300 meters 116. Gateway 126 also provides interface between backbone network 120 and meters 116 in a given LV cell/network.

Data carried in MV network 108 and fiber network 124 for system 100 may be essentially the same content. In one configuration, system 100 may utilize a fiber network (including part of network 124) from head end 118 to substation 114 and utilize MV network 108 to connect to gateway 126. Alternatively system 100 may utilize a fiber network from head end 118 to gateway 126. It will be seen that utilizing network 108 as part of system 100 has an advantage of reusing a transmission infrastructure of the MV power lines without rebuilding a separate network.

In network 134, meters 116 are a second level connected to their respective gateway 126. Other configurations and sub-roots can be provided.

Gateways 126 serve as a transparent network communication interface between meters 116 and head end 118. Communications between meters 116 and gateway 126 are provided through the LV lines in network 110, shown as high speed BPL channel 132. Communications between gateway 126 and head end 118 can be provided over MV network 108 and/or network 124. When gateway 126 processes a transmission from meter 116 intended for head end 118, it forwards the transmission to router 122 without examining its payload contents. Similarly, when gateway 126 processes a transmission from head end 118 for meter 116 it does not impede the flow of the message downstream.

BPL gateway 126 provides minimal impedance to the flow of data between head end 118 and meters 116. As such, real time data and instructions can be provided between head end 118 and meters 116. For example, in processing a communication from meter 116 to gateway 126, upon receipt of the related data packet, in one embodiment gateway 126 does not examine the payload of the packet and does not hold the transmission of the packet. The packet may be examined to identify destination parameters. Preferably any queuing of the packet is restricted to transmission issues for the network.

The contents of the payload or the source meter 116 information is not used as a criteria for determining whether and/or when to forward the packet. In one embodiment, BPL gateway 126 is a communication device that is part of the network communication infrastructure and is not built with any metering intelligence. Gateway 126 effectively provides no content-based delay of transmission of the packet. Such BPL gateway 126 is thus completely transparent to automatic meter reading ("AMR") transactions in system 100.

In one network configuration, gateway 126 operates as a bridging device for network 110 (and ultimately network 108) with meter 116 to translate communications from one protocol in one network to the bridged network. Here, gateway 126 translates communications between network 110 encoded in a powerline media protocol to an Ethernet media protocol for meter 116. In system 100, when initiating communications from head end 118 to meter 116, head end 118 creates an IP packet with a destination IP address of meter 116. This packet is inserted into network 108 at head end 118 and is routed via the related TCP/IP protocol gateway 126, passing through intermediary network devices including backbone network 120, routers 122 and gateway 126 before reaching meter 116. In processing communications, for example, router 122 examines the destination of the data packet and forwards the data packet to backbone network 120. To reach head end 118, the data packet may need to pass through one or more routers 122.

An embodiment also provides communications backup. When communication channel quality issues between a particular meter 116 and gateway 126 are detected, that meter 116 may transmit its data packet to another meter 116(*b*) in the local network 134. In turn, meter 116(*b*) forwards the data packet to gateway 126. As such, in this embodiment, second meter 116(*b*) may be used as a message repeater for meter 116.

Error detection and message repeating is managed in part by gateway 126 for its connected devices (including meters 116). Gateway 126 has access to a routing table for its meters 116 and other network connections. Periodically, gateway 126 inspects its listed connections (using its routing table) for connected carriers. Gateway 126 may receive status messages from meters 116 and other connected devices. By analyzing these messages, gateway 126 can determine the connectivity status of meters 116. As such, if an error connection condition is identified from a particular meter 116, gateway 126 can initiate commands to neighbouring devices (including meter 116*b*) to provide an alternative communication path for meter 116 to gateway 126.

Using BPL technology, configuration system 100 provides high speed two-way communications between head end 118 and meters 116. Effectively, head end 118 can be provided with telemetric data from meters 116 in real time. System 100 reduces messaging delays and unnecessary queuing of communications (both downstream from head end 118 to meters 116 and upstream from meters 116 to head end 118).

BPL technology as implemented in system 100 provides network connectivity layers up to the TCP/IP layer. Gateway 126 and meters 116 are packet based and are IP-addressable. System 100 also uses a packet switching network that allows multiple concurrent transactions to be initiated from head end 118 over the TCP/IP network to reach many meters 116 directly. Devices in system 100 are preferably always connected to system 100. For example, when a message from a device in system 100 is created and inserted to system 100 for transmission, the device preferably does not have to go through a log-on process. Similarly, a device receiving a message preferably does not have to go through a log-on process before checking for messages. This physical level provides data integrity, which can eliminate or reduce the need for handshaking between devices. This implementation provides improved performance in terms of speed and message redundancy over existing communication protocols of existing AMI systems, where data is transmitted serially and devices must log on to access functions.

An embodiment of system 100 uses simple network management protocol (SNMP) for communications between head end 118 and meters 116. Other application larger network protocols may also be used for this purpose. Communication module 128 has modules to decode SNMP message and request a specific OBIS object from the meter module 130. Network efficiency in system 100 is improved by providing data analysis intelligence in communication module 128 inside meter 116 as AMI data processing may be operated in parallel.

Use of BPL in system 100 provides electrical transmission and data collection and transmission in one system. This allows large scale and high speed data collection by head end 118 and stable communication for system 100.

FIG. 1B shows further details of a meter 116 at unit 104. At unit 104, a series of smart devices 136 are provided that connect to meter 116. Therein, where data communication between head end 118 and smart devices 136 are provided through meter 116. Smart devices 136 may include refrigerators, washers, dryers, plug-in electric car chargers, and any other electronic devices or appliances and provide operating telemetrics to electricity their usage, status and other features.

In one embodiment, meter 116 may repeat communications for other smart devices 136 coupled to LV network 110 and also provide communications to one or more of smart devices 136 operated on other types of networking protocols, such as a Zigbee (trade-mark) network, through bridging device 138. In this embodiment, meter 116 further functions as a bypass device and repeater simultaneously, providing additional flexibility and redundancy for messaging among elements in system 100.

In an embodiment, meter 116 will receive upstream transmission packets from one or more smart devices 136, through bridging device 138 or by itself. Meter 116 will retransmit those transmissions on BPL channel 132 to gateway 126, which in turn will retransmit the packets to router 122 and ultimately to head end 118. Smart device 136, bridging device 138 and meter 116 contain information stored in their memory modules to receive packets address to it and to re-address those packets with the address of the corresponding destination device.

Figure 1C:
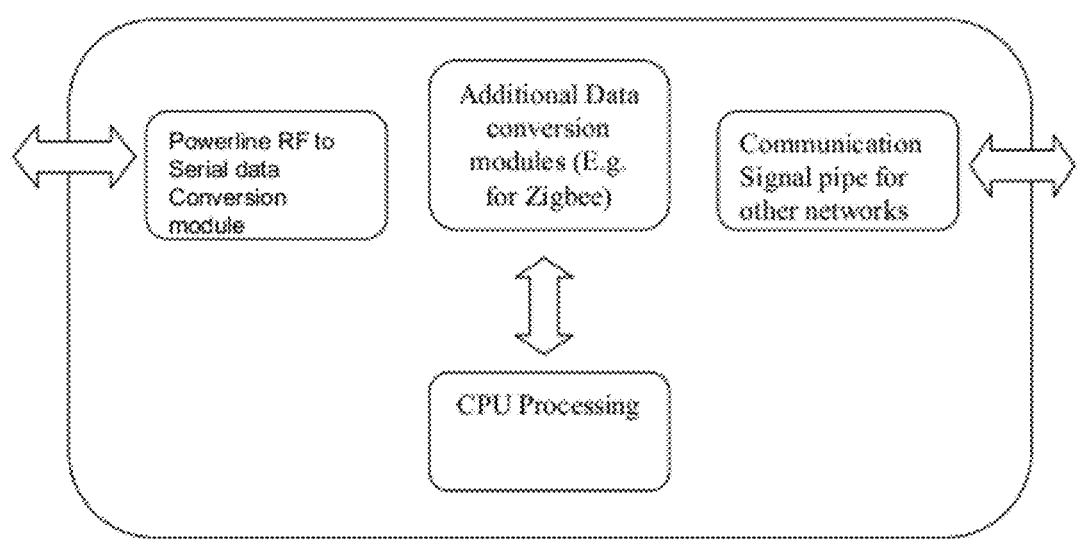
FIG. 1C is a block diagram of the bridging device of FIG. 1B.

FIG. 1C shows a block diagram of one embodiment of bridging device 138. Bridging device 138 include a powerline port (not shown) which converts powerline data into serial data. This serial data can be further converted to another protocol used by smart devices 136. Depending on the type of smart network at the premises, for instance, a radio frequency (RF) based network, the converted signal may be provided into a RF transceiver for communication with other smart devices 136 in unit 104.

The extension of data transmission and processing capabilities of system 100 to unit 104 can be used to provide other IP data services such as broadband internet, voice over IP, and video surveillance, through BPL modem 140. Modem 140 receives a powerline signal and converts it to an Ethernet signal which provides network connectivity, including, without limitation, access to the Internet, to computer related equipment. As such, meter 116 provides a single interface for monitoring power usage at unit 104 and additional network connectivity for unit 104. Previous prior art systems do not provide both these features.

Figure 2A:
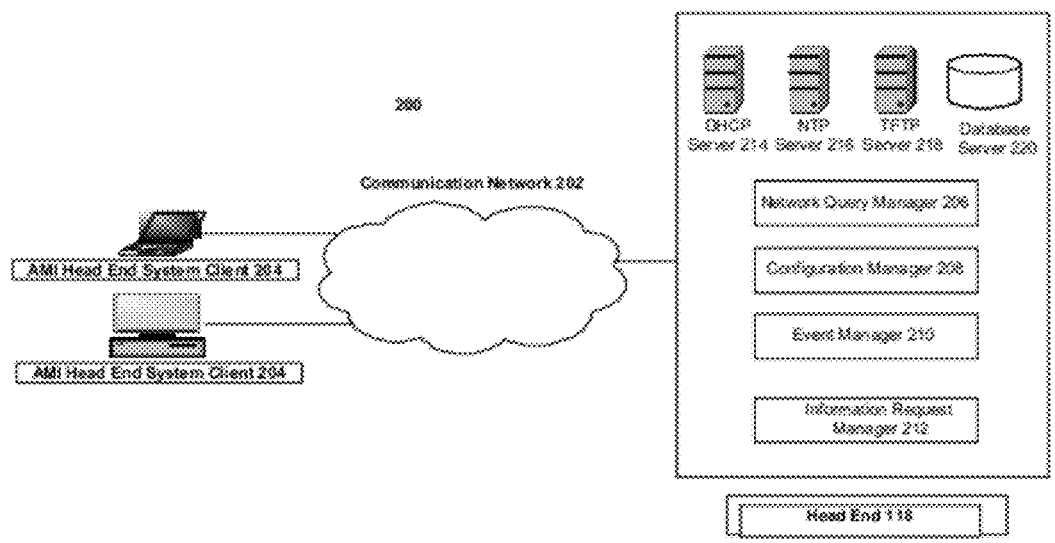
FIG. 2A is a schematic diagram of the head end as provided in FIG. 1A.

Now, further detail is provided on head end 118 at 200. FIG. 2A shows head end 118 and AMI head end system client 204. Communications between head end 118 and client 204 may be through provided through network 202. Client 204 provides a control interface for an administrator for head end 118. Software for head end 118 is installed on one or multiple server computers having a microprocessor and communication connection to the network, which are typically located at the Network Operations Centre (NOC). Software for the head end client 204 is installed on a connected computer. Software for head end 118 and head end client 204 may be deployed on the same computer or on one or more different computers. Communication network 202 may be a private or public network. Head end client 204 generates graphical user interfaces allowing administrators and operators of head end 118 to access services provided by head end 118 and to monitor, configure, and control various aspects of system 100, including, without limitation, gateways 126, meters 116 and communication connectivity quality of MV network 108 and LV network 110.

In one embodiment, head end 118 comprises query manager ("NQM") 206, configuration manager 208, event manager 210, and information request manager 212. Head end 118 further comprises Dynamic Host Configuration Protocol ("DHCP") server 214, network time protocol ("NTP") server 216, Trivial File Transfer Protocol ("TFTP") server 218, and database server 220, each of which provides functional modules of head end 118 to provide network management capability in system 100. Event manager 210 provides fault detection and notification capabilities, which include generation of alerts, automated actions, event correlation, trap/event/alert filtering to detect, isolate, and notify malfunctions in system 100. Information request manager 212 allows head end system client 204 to request metering data and network management information stored in database server 220. NTP server 216 provides clock synchronization capability for meters 116. TFTP server 218 allows BPL gateway devices 126 and meters 116 to download new firmware remotely. NQM 206 is responsible for pulling and receiving event data or scheduled data collections from BPL network elements, such as meters 116 and/or gateways 126. Configuration module 208 initializes each BPL network element and manages their configurations. Event manager 210 processes events (e.g. messages, alarms, etc.) received by NQM 206, and stores and correlates event data into information and responses used by head end 118. Request manager 212 communicates with client software 206 and relay messages between client 206 and head end 118. Servers 214, 216, 218 and 220 support computer services provided on a Microsoft Windows (trade-mark) operating system platform. Comparable servers are provided in other operating system platforms, such as in linux (trade-mark) or UNIX (trade-mark).

NQM 206 also is a data collection engine, collecting system-wide metering data from meters 116 located at units 104. It also collects network management information from BPL gateways 126 and meters 116. NQM 206 determines status information for elements in system 100, such as whether a BPL gateway 126 or a meter 116 is active or not, whether it has exceeded key performance parameters, and identifies inter-device link faults. Data collection may be performed at regular scheduled intervals or on demand.

Configuration manager 208 discovers and registers newly installed BPL gateways 126 and meters 116. New meters may initially need to request/obtain an IP address. This request may be intercepted by manager 208 and its MAC address information may be evaluated and compare if this MAC address exists in database 220 at head end 118 to determine if the meter is trying to register for service. Configuration manager 208 also provides remote control and configuration capability to allow administrators and operators having access to head end client 204 to control and configure gateways 126 and meters 116 remotely. In one embodiment, when an operator issues a disconnect command for a meter 116 through head end client 204, configuration manager 208 will send the command to a specified meter 116 to disconnect the electrical service of a corresponding end unit 104 from LV network 110. Configuration manager 208 also allows an operator to send a new time of use ("TOU") table to meter 116 if there is a change to the electricity provision contract from the corresponding unit 104. Configuration manager 208 further provides IP addresses to gateways 126 and meters 116 through DHCP server 214.

Figure 2B:
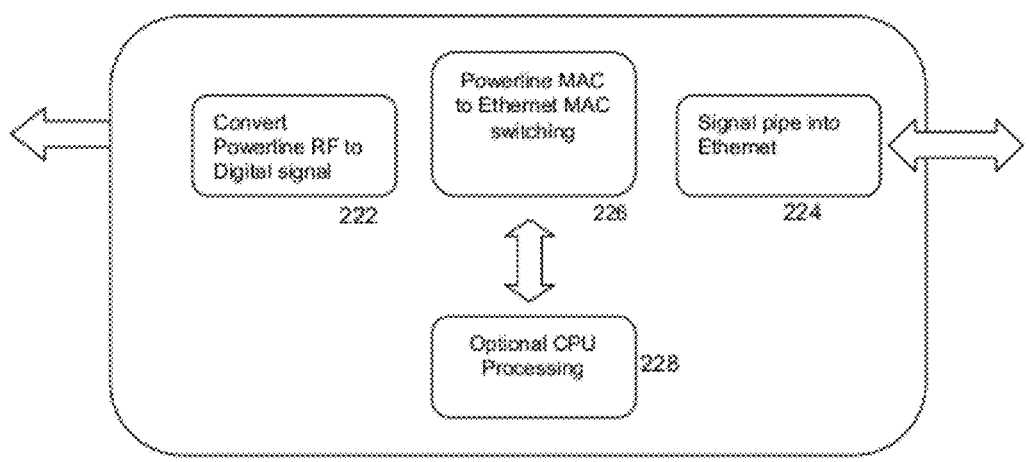
FIG. 2B is a block diagram of functions of the head end of FIG. 2A.

FIG. 2B provides details on process flow for modules in FIG. 2A. Meter 116 may transmit a message on the power line network in system 100 towards head end 118. This message will be received by gateway 126. In gateway 126, process 222 analyzes the powerline signal and extracts the message contents therefrom, which is then converted into a digital signal. In process 224, gateway 126 transmits the digital signal to a switching module in gateway 126 which then connects to a designated port, for example, an Ethernet port. In process 226, the digital signal is forwarded to an Ethernet transceiver which in turn linked to an upload port. Preferably, triggering parameters in the switching module can be set so that notable packet/information are switched to an internal CPU 228 for further processing. For example the control commands which are specific to gateway 126 may be provided.

Communications between meter 116 and system 100 are provided through a hybrid push and pull messaging system. At head end 118, a server first groups the connected meters into a series of smaller sub-networks of meters. Each sub-network is identified as a BPL segment. Meters in a segment may be linked by location, type, assigned owner (e.g. meters for the same company), etc. An exemplary BPL segment may include all meters 116 and BPL nodes connected after distribution transformer 112, as per LV network 110. The server has data relating to its load index, which provides a maximum figure for how many meters the server can communicate with simultaneously or within a certain time period without being overloaded. The index may be provided to the system by the operator. If the number of messages exceeds the index for that time period, the server may not be able to process messages that are received in a timely manner. The load index may be set to different values depending on certain conditions, such as the current time, day, season, network conditions etc. A range of index values and conditions may be provided and the system may select an appropriate index for the current conditions of system 100 and/or its environment. Based on the load index, the server calculates how many BPL segments that it can communicate with simultaneously once it starts to retrieve meter data from system 100. For example, consider a system where there are 1000 BPL segments, where each BPL segment sub-network has 200 meters and the load index is set to be a maximum of 2000 meter readings simultaneously. With that index, the server can communicate with 10 BPLs simultaneously (10 BPLs×200 meters/BPL=the load index). The server selects a first set of 10 BPL segments and sends one broadcast message to each selected BPL segment. As such, the server sends a block of messages to the selected BPL segments. The selection of the BPLs can be made on any basis, including random, proximity to the server, number of meters in the BPLs, power draws for the BPLs, etc. Upon receiving a broadcast message, meters 116 in the first set of BPLs that receive the message treat its receipt as an indication that the server is available to receive data from the meter. As such, at that instance, it is possible that the 2000 meters (10 BPLs×200 meters/BPL) may collectively all attempt to push their messages to the server at around the same time.

Each meter 116 may send (or "push") one or more messages to the server. Each meter may have a data queue which stores its pending meter profile data to be transmitted. When the server sends a message to meters 116 that it is available to receive data, meters 116 can deplete their data queues and send one or more meter profile responses to the server depending on how much data is in the queue waiting to be sent. Once the queue is depleted, meter 116 will send an end of message to notify the server it has no more data to send.

In the above scenario, when the server has received responses (expected responses) from the initial 10 BPL segments (which would provide a total possible 10×200=2000 simultaneous replies, which does not exceed the load index of 2000), the server can send an additional broadcast to a next segment (i.e. an identified 11th BPL segment) to continue with its system readings. The server at head end 118 sends additional broadcast messages to additional BPL segments as long as the net maximum number of outstanding requests is below 1800 (as 200 responses have been received). For example, in a broadcast scenario for a server having a load index of 2000, consider a situation where after one minute of sending 10 broadcast messages to a total of 2000 meters, the server receives 20 replies from each segment, i.e. 20 replies from 10 segments=200 replies. While the server is waiting for the remaining 1800 meters (2000−10×20) to reply, the server can also send an additional broadcast message to an $11^{th}$ segment to initiate that responses from meters in that segment, since it has 200 meters and the cumulative outstanding replies would be 1800+200=2000, which is still within the load limit. If there is another BPL segment that has more than 200 meters, then if that BPL segment is selected, there is a risk that the server may be overloaded with responses as the index will be exceeded. If there is another BPL segment that has less than 200 meters, then if that BPL segment is selected, the server will not be overloaded with responses as the index will not be exceeded. This process and algorithm attempts to maintain an as-full-as-possible message throughput count for the system to be as close as possible to the load index (here 2000 messages). In another embodiment, the server may wait until it has received responses from all or substantially all, responses from the initial broadcast (e.g. from the 2000 requests) before sending a second broadcast (e.g. to a second 2000 meters).

In summary, an embodiment provides a method for communicating messages from the server, at a central location, to a plurality of meters in the power network. From the central location, an embodiment obtains status updates from the meters modules by transmitting broadcast messages to a first network, such as MV network 108, destined for delivery to meters in LV networks 110. The broadcast messages are transmitted in a block of messages, with a portion of the broadcast messages sent to a particular LV network 110. An embodiment will monitor for responses to the broadcast messages from meters in the particular network. An embodiment will transmit a second set of broadcast messages for delivery to a LV network 110, when said responses to the broadcast messages at least match the size of the second set, i.e. the number of targeted meters in the second set is not bigger than the number of responses received. The total number of meters expected to provide responses to the initial block of messages transmitted is less than the current load index for the server.

Additional features are provided for monitoring and managing message responses. During message polling, there may be meters 116 that experience poor connectivity to system 100. This may result in some meters 116 not receiving the broadcast message and/or the loss of pushed data from meters 116 before reaching the server. An embodiment provides thresholds and monitors for the server to identify any such situation. A response to the situation is to trigger a re-broadcast message from the server. For example, a server may be expecting meters from a particular a BPL segment to push message to it, but the server subsequently determines that a certain number of meters 116 in the segment did not reply with data or end of message. In response, the server can re-broadcast the meter reading available message to the BPL segment. The number of meters can be set to a set number or percentage (e.g. 10% non-responsive). If the server expects meters in a BPL segment to push a message, but if a higher number of meters have replied, then instead of re-broadcasting a request message to all meters 116, the server may transmit a unicast message to send individual meters to indicate that the server is available to receive data. The higher number may be set as a static value or as a percentage of non-responses (e.g. between 0 and 10%). The message may be unicast multiple times to the non-responsive meters. If a meter still does not reply with any message after sending unicast message, the server may declare that this meter is not reachable at present and may remove that meter from the current data retrieval loop. Subsequent data retrieval efforts may be made to that meter at a later data collection interval.

Using a strictly push mechanism can increase the efficiency of readings and also significantly reduce data latency. However in a massive meter network, a strictly push system can overload the server with messages. A hybrid push/pull message system as noted above allows the server to control the expected load and have the efficiency and reduced response time of a push network. For an embodiment, as opposed to permitting all meters 116 in system 100 to push their data independently into system 100, an embodiment provides groups of meters 116 (as segments) to push data to system 100 at distinct instances of time. It can be seen as a network-wide time division multiple transmission system. A data pull mechanism by the server enables the server to send messages to meters 116 for specific reports. A data push mechanism allows meters 116 to respond to such messages asynchronously when the request is received. As such, there is an initial time-regulated set of messages that pull for data by the server and (time unregulated) pushes of responses from meters 116 as the messages are received.

Figure 3A:
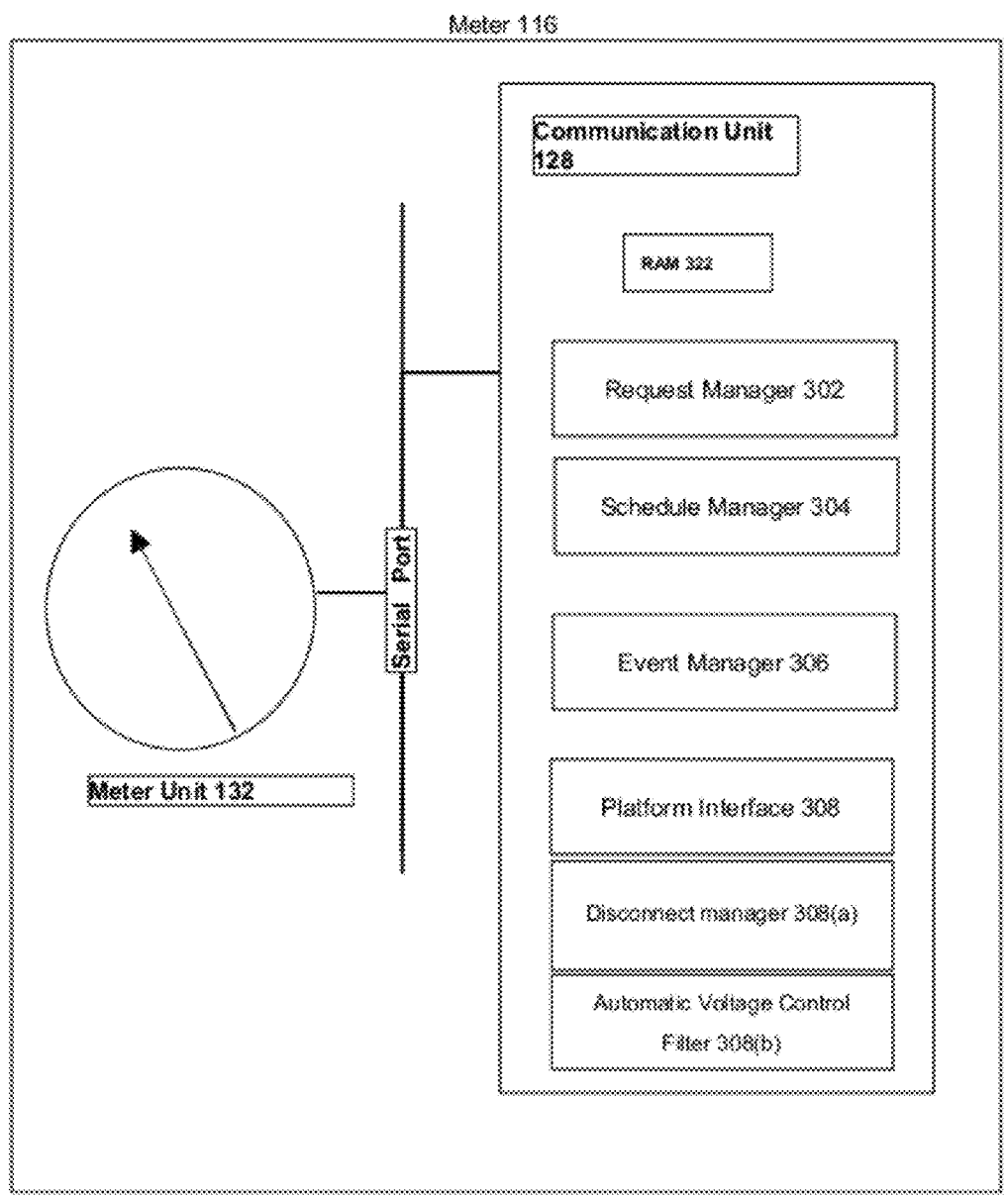
FIG. 3A is a schematic diagram of features of a meter at an end unit in the network of FIG. 1A.

FIG. 3A provides further details on a remote meter reading processes as used in meter 116. As previously noted, meter 116 provides telemetrics on devices in unit 104 to head end 118. Meter 116 may be embedded into a traditional exterior meter connected to a power feed from LV network 114 that connects to unit 104 associated with meter 116. Meter 116 may also be provided as a standalone computer, a laptop computer, a mainframe computer, a cellular telephone or another device having such computer-based components. Meter 116 communicates through data sent and received through powerlines, but meter 116 may also communicate with head end 118 through an internet connection, a wireless internet connection, a WiFi connection, an Ethernet connection or any other connection protocols and systems known to a person of skill in the art.

Meter 116 comprises communication module 128 and meter module 130. Communication module 128 generates and processes outbound communications from meter 116 to network 114 and receives and processes inbound communications received over network 114. Communications can be sent to external devices, such as head end 118, a device at substation 114 and/or gateway 126. Communications can be ultimately addressed any of such external devices. Meter module 130 is a meter connected to a power feed to provide power usage measurement and other electricity related data. Communication module 128 is connected to meter module 130 through a serial universal asynchronous receiver/transmitter ("UART") interface, although other communication links can be provided.

One embodiment of communication module 128 comprises request manager module 302, schedule manager module 304, event manager module 306, and platform interface 308. Request manager module 302 receives messages from head end 118 through the network of system 100 and processes them. In one embodiment, simple network management protocol ("SNMP") is used and request manager module 302 accepts or sends requests from head end 118, and processes them accordingly. Requests from head end 118 may be grouped into two categories:

1. Requests that require interaction with meter module 130; and
2. Requests that can be processed without interaction with meter module 130.

Upon receiving requests in the first category, request manager module 302 sends a command to meter module 130 immediately and sends a response from meter module 130 back to head end 118. For the second type of requests, request manager module 302 will process the request immediately. If processing a request results in the occurrence of an event that needs to be recorded, request manager module 302 may store a message in an event message queue. The message queue used to pass data from request manager module 302 to schedule manager module 304, there is a corresponding queue which passes data in reverse. In one embodiment, messages between each module in meter 116 can be exchanged in a synchronized transfer scheme. Processes and modules in meter 116 may function on an event based system (such as a state machine).

Schedule manager module 304 executes schedule tasks at predefined time. The schedule manager module may maintain a schedule for the tasks and may generate reading commands according to the schedule. Exemplary tasks include performing:

Clock synchronization of the meter's clock to a global time for the system (i.e. a system time), which may be maintained by at head end 118;
Rate switching, where different power rates can be applied to calculating power usage according to a schedule which may change rates for different times of the day/week/month/year;
Periodic meter reads of meter module 130; and/or
Periodic meter event detection.

Schedule manager module 304 also generates signals which can be used by a power regulator/diverter to regulate the amount of power to provide a fraction of power (any value between 0% and 100%) of the available power on the transmission line that can be provided to the related unit 104. In one embodiment, module 304 provides signals that either allow power to be provided to its unit 104 or disconnect unit 104 from the power in network 110 by controlling the physical connection to the power through a relay in meter 116. As such one component of schedule manager module 304 is a connection management module (not shown). The connection management module may be provided as part of or as a separate module to schedule manager module 304. The connection manager module may evaluate readings and data relating to past power usage at the site and generate connection signals for the meter to the power transmission system in view of the readings.

In determining whether or not to connect or disconnect unit 104 from the power, a set of one or more conditions/thresholds may be monitored by module 304. The conditions may relate to operating conditions of network 110, meter 116 and/or unit 104. The conditions may include a threshold parameter. For unit 104, operating conditions and thresholds may include a maximum (or minimum) amount of power drawn (in watts) and a threshold of power drawn over a window of time (e.g. during a peak consumption period, during rush hour, in a morning time window, etc.) As such, manager module 304 provides a software "fuse" function that can be triggered to limit the amount of power provided to unit 104. When the software fuse is not "blown", a connection to the power for meter 116 is maintained. When the software fuse is "blown", the connection to the power for meter 116 is broken. The software fuse setting can be set and reset according to conditions detected by meter 116. The conditions and parameters may be provided directly to unit 104 and/or module 304 by a user or through management software at head end 118. This connection/disconnection function may be provided in a separate module in meter 116.

In operation, schedule manager module 304 may periodically send a command to meter 116 to obtain a reading of the current amperage drawn (in amps) and a power reading and convert the figures into a power reading (in watts). The data may be stored to a memory by module 304. Module 304 may send period and/or continual commands on certain intervals (e.g. every 1-20 minutes, once a day, etc.) until a threshold is reached (e.g. 100 readings, a set of readings has been obtained for the peak hours). As one exemplary threshold, if the total current or power reading for a period exceeds a related threshold, then a trigger condition is set to schedule manager module 304 send a command to platform interface 308, which in turn send a command to module 132 to disconnect the relay of meter's power output from the power line. This function acts as a software fuse configurable by an application operating at head end 118. A reset of the parameters for the fuse (e.g. a restart of the monitoring of the trigger conditions) may be provided by a message sent to meter 116 through a switch on meter 116.

Event manager module 306 periodically checks if a new event is provided to the event message queue. In one embodiment, for each new event in the event message queue, event manager module 306 may generate and send a SNMP trap (i.e. a message) to notify head end 118 of any new events detected by meter module 130. When multiple events are triggered, event manager module 306 stores records of the events in a memory queue and sends the earliest event to head end 118. When head end 118 provides a reply acknowledging this event, the next earliest event is then sent to head end 118. If no reply to a first transmission of an event is received within a first timeout period, event manager module 306 attempts a second transmission. If no reply to the second transmission of an event is received within a second timeout period, event manager module 306 attempts a third transmission. If no reply to the third transmission within third a timeout period, the event manager may enter a loop to retry transmissions periodically. In one embodiment, the first timeout period is less than the second timeout period, which is less than the third timeout period. However, different values for the timeout periods and the number of timeout periods can be provided.

Platform interface 308 translates commands from other modules of communication module 128. Platform interface 308 receives messages from request manager module 302 and schedule manager module 303. In case of a real time request, such as disconnect request or on demand read request, request manager module 302 forward these messages to platform interface 308 for data communication to meter module 130. In case of a scheduled periodic meter read, schedule manager module 304 will send a message to platform interface 308 for data retrieval. In one embodiment, platform interface 308 translates the commands to IEC 62056-21 compliant commands for use by meter module 130. It also parses raw meter readout into messages and profiles for other modules of communication module 128.

Through the modules of meter 116, remote and scheduled processes can be executed including scheduled recording and/or transmission of meter data, controlling and programming data recordal rates for meter 116, selective connection and disconnection controls for meter 116 to the power line and evaluation and reaction to configurable detected thresholds on the meter data, including generation of real time event notifications based on the data analysis.

In one embodiment, processes are implemented in a communication chipset of meter 116, which allows shared data and memory access. Meter intelligence software operating on the chipset can provide direct access from the communication protocol of the transmission system to the data of meter 116, thereby eliminating a protocol translation which can be present when data is exchanged between two chipsets.

When a meter reading request is received from system 100, meter communication module receives this message, within the same operating system in the chipset, it obtains the requested data from its memory and generates and sends a response to system 100.

When a meter control message is received from system 100, a meter communication module in meter 116 receives this message and meter 116 can conduct internal data validation, make calculations on the data, generate commands for meter 116 and provide responses and messages after performing these operations.

The communication module has schedulers which can periodically evaluate a set of pre-set conditions. Upon detection of an anomaly, it can send a message to a pre-defined central server software.

Figure 3B:
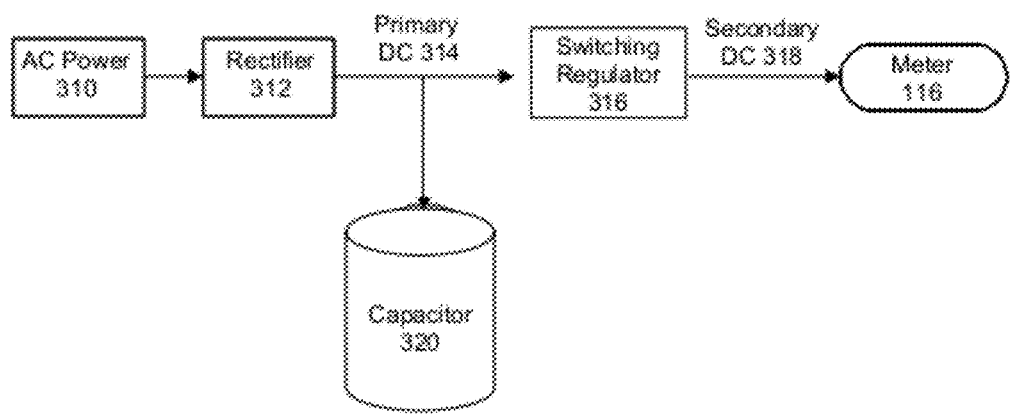
FIG. 3B is a schematic diagram of a power reserve module of the meter of FIG. 3A.

Now, further detail is provided on a power management feature in meter 116. FIG. 3B illustrates power features for meter 116. AC power 310 first passes through rectifier 312, which converts alternating current (AC) power to direct current (DC) power module 314. DC module 314 passes the converted power signal through switching regulator 316, which lowers the voltage and provides the output to the secondary DC module 318, which supplies power to meter 116. Capacitor 320 is connected at the output of rectifier 312. Capacitor 320 will have ancillary components and circuits connected to it (not shown). The size of capacitor 320 can be selected to be a sufficient size to store a charge that can be dissipated to meter 116 to provide sufficient temporary power to same. In this embodiment, the capacitor is 100 uf. Other capacitor values up to 1 f may be used. A bank of capacitors (having the same or different values may be used). A discharge resistor network (not shown) can be connected to capacitor 320 to provide a suitable discharge pattern for regulator 316. A voltage switching circuit (not shown) can be connected to capacitor 320 to provide a charging signal for capacitor 320. Values for the resistors in the network can be selected to provide different discharge rates. Capacitor 320 provides a power reserve and is connected to primary DC module 314. In one embodiment, capacitor 320 provides a voltage reserve of approximately 450V (for a meter connected to a 240 V AC line). When AC power 310 is operating normally, capacitor 320 receives the voltage applied to it and stores the energy. The stored energy has a voltage equal to the output voltage of primary DC module 314. When AC power module 310 lost AC input or is de-activated (e.g. through a power outage), capacitor 320 discharges its stored energy into switching regulator 316 until its voltage is lower than the minimum input voltage of switching regulator 316. Due to the nature of the resistor/capacitor network the discharge to regulator 316 occurs automatically as the output from rectifier 312 drops below the charge stored in capacitor 320. Switching regulator 316 has a wide input voltage range. However, the minimum acceptable voltage for its input is generally much lower than the nominal value of the primary DC module 314. Energy stored in capacitor 320 is proportional to the voltage of primary DC module 314 squared. As such, an exemplary 85% drop (approximate value based on European homes) in the voltage of capacitor 320 indicates 98% efficiency in energy. For example, in this embodiment, if the AC input is 240 VAC, then the DC primary would be 240 VAC×$\sqrt{2}$=339 VDC. The lowest input voltage that should be provided for meter 116 is 35 VAC, which is 35 VAC×$\sqrt{2}$=50 VDC. A voltage drop of 1×35/240=85% can produce an energy depletion of $(339^2-50^2)/339^2$=98% efficiency in the capacitor. The reserve energy in capacitor 320 is able to dissipate and supply appropriate power to the meter's circuits and components. Comparable calculations and capacitor values can be provided for meters that are connected different voltage line signals, such as 110, 100 and 120 AC voltage lines.

In other embodiments a secondary voltage supply can be provided in lieu of or in addition to capacitor 320. Such secondary voltage supply can be a battery, such as a rechargeable battery.

In other embodiments, capacitor 320 (and its related charging and discharging circuits) may be located between switching regulator 316 and secondary DC module 318. In other embodiments, multiple capacitors and/or secondary voltage supplies can be provided at any locations in FIG. 3B.

Capacitor 320 is provided to ensure that a continuous supply power is provided to meter 116, in the event of a power failure. The energy provided from capacitor 320 is not meant to provide long term power—its power reserve is in the order of several seconds. In this discharge time, meter 116 is provided with enough time to recognize that a power failure condition has occurred to enable it to send a notification message to head end 118 to indicate such power failure. Meter 116 contains an AC sensor circuit (not shown), which detects an AC signal loss and triggers release of signal to an input/output channel for the CPU of meter 116, which can then be detected by meter 116. When AC power fails, capacitor 320 discharges its stored voltage to regulator 316. As capacitor 320 depletes its energy, its voltage also drop accordingly, eventually dropping to 0 V, thereby exhausting its stored energy. When the voltage has dropped to a certain level, capacitor 320 cannot provide energy to support meter 116's normal operation. A voltage threshold circuit (not shown) is provided to detect when the voltage output of capacitor 320 drops below a threshold and generates a signal. The signal can be used by meter 116 to generate a "last gasp" message that is sent to head end 118. At such an instance, meter 116 will shut down shortly thereafter. Having a high voltage, which in one embodiment is 450V, on primary DC circuit 314 provides a large power reserve margin before capacitor 320 discharges to the minimum acceptable power input level, thereby tending to maximize the time that capacitor 320 provides useful energy to meter 116.

BPL technology utilizes a data spectrum transmission bandwidth of approximately 2 MHz to 30 MHz. This range of frequency spectrum can be used to couple between a large discontinuity gap in a physical line as long as the physical line from the discontinued points are larger than a wavelength of the respective frequency. This bandwidth has a coupling affect in RF transmission. Using such bandwidth will allow RF signal to "jump over" broken wires. As such, when an LV power line is cut or a fuse in the connection is broken, the discontinuity that has been formed can be traversed as the BPL signal can still bridge and "jump over" the physical discontinuity and keep the link alive. This provides a late opportunity to send a "last gasp" message from meter 116 to advise head end 118 that meter 116 has lost power. Often when a MV or LV fault occurs, the connection points of different type of equipment may appear to have a discontinuity of in the related transmission system (e.g. a break in a power line). The discontinuity may be present anywhere in LV network 110. The size in a discontinuity can be typically several mm to several dm in length. The powerline carrier for messages for an embodiment which is provided in approximately the 2 MHz to 30 MHz range in most cases can cross over such discontinuity and still establish a link. As such, while power signals may be lost, the discontinuity may not block the RF link as long as the wire on each side of the discontinued points are longer than one wavelength of the respective frequency. This allows meter 116 to use its reserve power drawn from capacitor 320 to generate and send a "last gasp" message to cross the breaking point towards head end 118 and notify such power service outage event. As such, messages from meter 116 that are carried on a carrier frequency of between approximately 2 MHz and 30 MHz are preferably generated and used.

Next, details are provided on meter connection/disconnection processes used by an embodiment of system 100. Specifically, meter 116 is equipped with an electricity connector/disconnector module that can be controlled both locally and remotely to completely disconnect and connect electrical supply at the location associated with unit 104.

Figure 4:
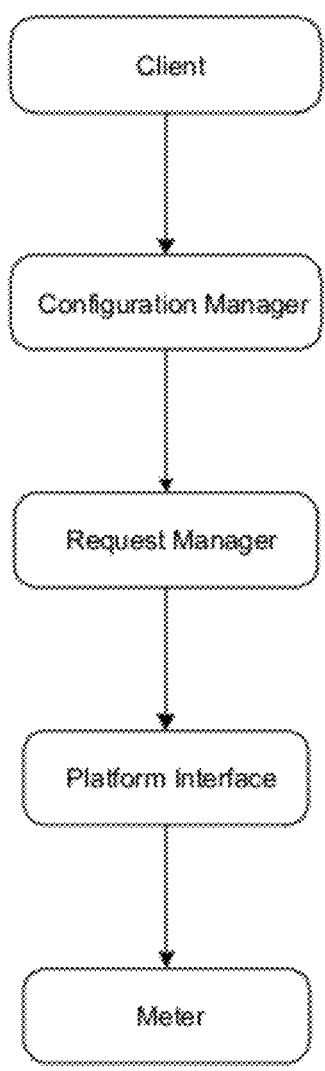
FIG. 4 is a flow chart showing a connection algorithm used by the meter of FIG. 3A.

FIG. 4 illustrates one embodiment of the remote and local connect/disconnect functions of meter 116. The functions comprise the following processes:

1. Through head end 118, head end client 204 initiates one of the four remote control actions (remote connect, remote disconnect, enable local button control and disable local button control) and sends it to configuration manager 208;
2. When configuration manager module 208 receives action, it validates the action, parses it into a corresponding SNMP set command, and then sends the request to through the network of system 100 to request manager module 302 of communication module 128 of meter 116;
3. Request manager module 302 will validate the data format and data content sent by configuration manager 206, and then forwards it to platform interface 308 upon validation; and
4. Platform interface module 308 validates the action received from requester manager module 302 and translates it into a meter-acceptable command, and then sends it to meter module 130 through a serial port.

Sub-modules may be provided in platform interface module 308, including disconnect manager module 308(a), which implements a disconnector control flow. Disconnector manager module 308(a) may be activated at head end client 204 through its GUI, from a remote control command sent from head end client 204 and/or automatically from head end 118.

In one embodiment disconnect manager module 308(a) utilizes a state machine for processes to transition among connected, disconnected and transition states. An exemplary state machine has four states and accepts four remote actions plus one local action to navigate through the states. Table A shows the four states and their corresponding meanings.

TABLE A

| States | Premises | Local control enabled | Remote control enabled |
|---|---|---|---|
| Connected | Connected | No | Yes |
| Disconnected | Disconnected | No | Yes |
| Ready_to_disconnect | Connected | Yes | Yes |
| Ready_to_connect | Disconnected | Yes | Yes |

Figure 5:
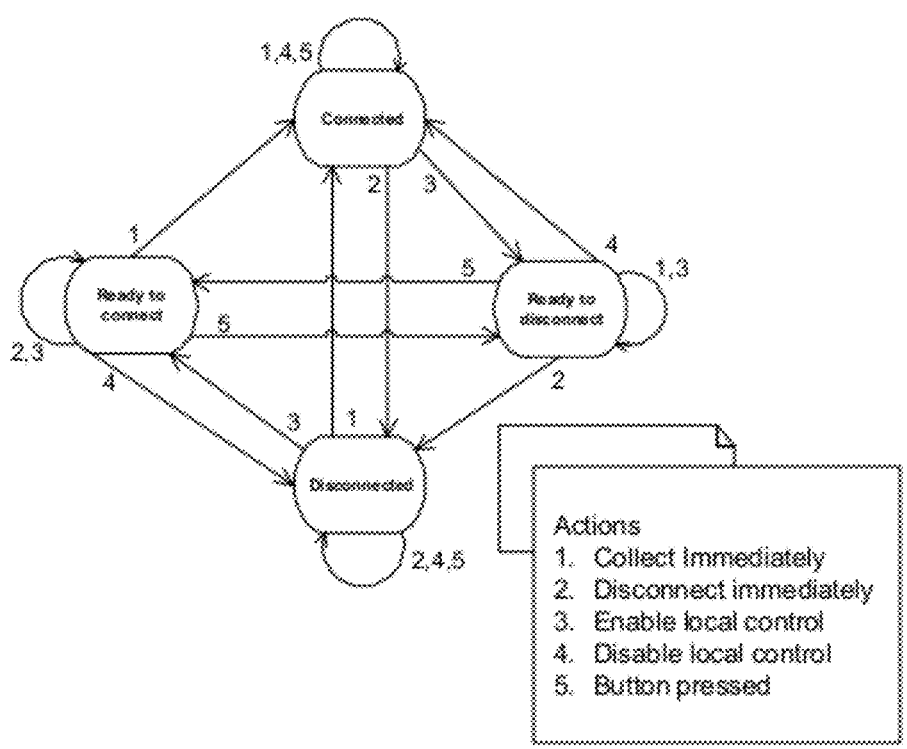
FIG. 5 is a state diagram of a state machine implementing a disconnect function for the meter of FIG. 3A.

FIG. 5 illustrates a state machine implemented by disconnect manager module 308 and the state transition of the disconnector control. Two states 502 and 504 indicate that the disconnect manager is connected to head end 118; two states 506 and 508 indicate that disconnect manager is disconnected from head end 118. The digits and arrows around each state are showing how each state can transit to others states. As noted, actions 1-5 are shown which provide exemplary stimuli to transit between states. Actions 1-5 include: 1) Collect data immediately; 2) Disconnect immediately; 3) Enable local control; 4) Disable local control; and 5) Button pressed.

Head end client 204 can remotely send commands to disconnect manager module 308(a) by sending a request to meter 116 to disconnect, connect, enable or disable local button control immediately. In one embodiment, to allow an operator to perform a local control of meter 116, a local signal in the GUI is first enabled by head end client 204 through a SNMP set command. Once local control at meter 116 has been enabled, disconnection or connection of meter 116 to the LV network 110 is dictated by the operator at meter 116. In one embodiment, a safety function is implemented at meter 116 that requires the operator to hold a switch on meter 116 for a predetermined time (e.g. ten seconds or more), to prevents the operator from disabling button unintentionally. In one embodiment, such switch is a button. Disconnector manager module 308(a) in platform interface 308 will initiate a message and push it into event message queue to trigger an SNMP trap to be sent to head end 118 whenever there is an occurrence of disconnector control state transition meter 116.

A meter disconnector status register implemented at meter 116 contains the information to indicate whether end unit 104 is connected or disconnected. In one embodiment, at communication module 128 of meter 116, the status of disconnect manager module 308(a) is stored in the RAM 322, and updated after every switching action of an electrical service. Meter 116 can be cut from a service of a customer and also can re-connect to the service of the customer by using a mechanical relay in meter 116 to the physical power connection related to the service. Multiple relays may be provided to provide stages of power to the meter. On boot-up, disconnect manager module 308(a) reads out the status of the disconnector from meter module 130, and compares it with the status stored in RAM 322 at communication module 128. Any discrepancy of the disconnector status will be reported to head end 118. In one embodiment, such reporting is done through a SNMP trap.

In one embodiment, meter 116 further comprises automatic control filters for protection of meter 116 and the electrical devices behind meter 116, including any smart devices 136, when one of the following conditions are detected:
1. Over-voltage;
2. Over-current; and/or
3. Meter tampering (e.g. opening of the case of the meter, unauthorized disconnection from power supply, etc.).

Over-voltage detection and reaction is provided in disconnect manager module 308(a) to prevent a high voltage signal from reaching and damaging meter 116 and connected electrical devices. In one embodiment, this over-voltage control function is provided through a configurable voltage threshold circuit and a decision stage built in the automatic voltage control filter 308(b). Automatic voltage control filter 308(b) polls a register value for meter 128 to monitor the voltage at the end unit 104. When automatic voltage control filter 312 detects a voltage at end unit 104 that is greater than a threshold, automatic voltage control filter 308(b) will initiate a disconnect command through disconnect manger 308(a), which in turn will send a disconnect command to meter module 128 through the serial port. Then disconnector will cause end unit 104 to be disconnected immediately from LV network 110 to protect meter 116 and electrical devices/components behind meter 116.

Over-current detection and reaction is provided in disconnect manager module 308(a) to prevent high current and short circuit from damaging meter 116 and downstream electrical devices. In one embodiment, an automatic current control filter 306(a) is provided in event manager module 306. A detected current can be evaluated to determine whether a short-circuit condition exists for meter 116. The automatic current control filter can read the electric current values of end unit 104 as measured by meter module 130 and identify any immediate increase of load. Upon detection of a sudden increase of electrical current which exceeds a maximum rated value or a configured value for a configured period of time, automatic current control filter 306(a) will maintain polling of the meter register value to monitor the current over the end unit 104. Once the current over end unit 104 is greater than a prescribed threshold, automatic current control filter 306(a) will initiate a disconnect command and send it to disconnect manger 308(a), which in turn will send a disconnect command to meter module 130 through the serial port. The disconnect manager module 308(a) will cause end unit 104 to be disconnected immediately from the LV network 110 to prevent further damage to its connected device 134.

In one embodiment, meter disconnect status integrity validation is built in to a meter disconnect status filter 306(b) residing in event manager module 306. The meter disconnect status filter 306(b) will re-disconnect meter 116 when meter 116 was inappropriately re-connected as a result of actions by persons at unit 104, such as tampering of the meter by an owner of premises. Upon meter 116 rebooting after reconnection, meter disconnect status filter 308(a) will keep polling the meter disconnector register value in the meter module 130 and compare it with the status stored in RAM 322 and in database 220. If the wrong connection status has been detected at the meter module 130, the meter disconnect status filter 306(b) will initiate a disconnect command and send it to meter through the serial port, and send it to disconnect manger 308(a), which in turn will send a disconnect command to meter module 130 through the serial port. Disconnect manager module 308(a) will cause the unit 104 to be disconnected immediately from the LV network 110. The meter disconnect status filter will also created a message, concurrently or with delay, and push it into the event message queue to trigger an SNMP trap to be sent to head end 118. A sensor can also be provided to detect when a case (i.e. a housing) for meter 116 has been opened. Comparable messages can be provided to LV network 110 upon the detection of an event indicating tampering of meter 116.

In one embodiment of system 100, a cluster control supports connect or disconnect of meter 116 within an associated subnet simultaneously. The cluster control uses the advantages of an AMI system built upon communication network using BPL technology. With the broadband networking and TCP/IP built in, head end client 204 can send a broadcast message to a specific subnet and disconnect manager module 308(a) in each meter 116 can accept the broadcast message and perform the action in accordance with the broadcast message. The cluster control improves the disconnector control performance and efficiency for the whole management of system 100. In one embodiment, a broadcast requesting disconnect or reconnect of units 104 is achieved by sending a broadcast SNMP message to an IP subnet. An IP subnet corresponding to a group of units 104 is often connected on the distribution transformer 112. The broadcast message will reach every meter 116 in a subnet and acknowledged by the request manager module 302. The request manager module 302 then will send a message to the platform interface 308 which in turn will relay the disconnect command through the serial port to meter module 130.

To trace control actions for audit purposes, platform interface 308 records each disconnector transition into a log file and synchronizes the log file with head end 118 periodically.

The utilization of BPL technology and the network infrastructure implementation allows system 100 to perform with greater efficiencies through the ability of collecting data and pushing instructions to meters 116 in parallel. The remote disconnect/reconnect functionality also allows an embodiment to control each individual meter 116 in the system and to provide security of the power feeds to end users at units 104. The remote disconnect function also allows rapid response to any potential problems to meters 116 and the end users.

One embodiment of system 100 further comprises periodic meter reading processes. In one embodiment, head end 118 performs two metering data pulling actions based on preconfigured intervals.

Communication module 128 in meter 116 periodically reads out all meter register values from meter module 130, constructs a profile entry using all the register values, and stores the profile entry in a profile file on its memory. In one embodiment, the memory of communication 128 is RAM 322. In one embodiment, the default polling interval is 15 minutes. In another embodiment, the interval can be set a given time interval (e.g. a multiple of 15 minutes) by head end 118. The same polling interval is used for all meters 116 managed by head end 118. Head end 118 provides batch configuration functionality instruction to push a new polling interval along with its activation time to all meters 116 managed by an embodiment. At the activation time, all meters 116 in system 100 implement the new polling interval without the intervention of head end 118.

System 100 provides a reliable method of collecting periodic usage and data updates from the entire AMI system, at regular and adjustable intervals. To facilitate this process, meters 116 support the setting of data collection intervals and the sending usage and data updates back to head end 118 at the specified interval. NQM 206 controls when and how to pull meter data. Within meter 116, event manager module 304 responds to the request from NQM 206.

Head end 118 periodically polls metering profile data from all relevant meters 116, and stores data in database 220. Head end 118 performs data consistency checks to guarantee that correct data is retrieved and stored, in-order and without gaps or missing data. This requires intelligent logic at both the head end and meter.

Figure 6:
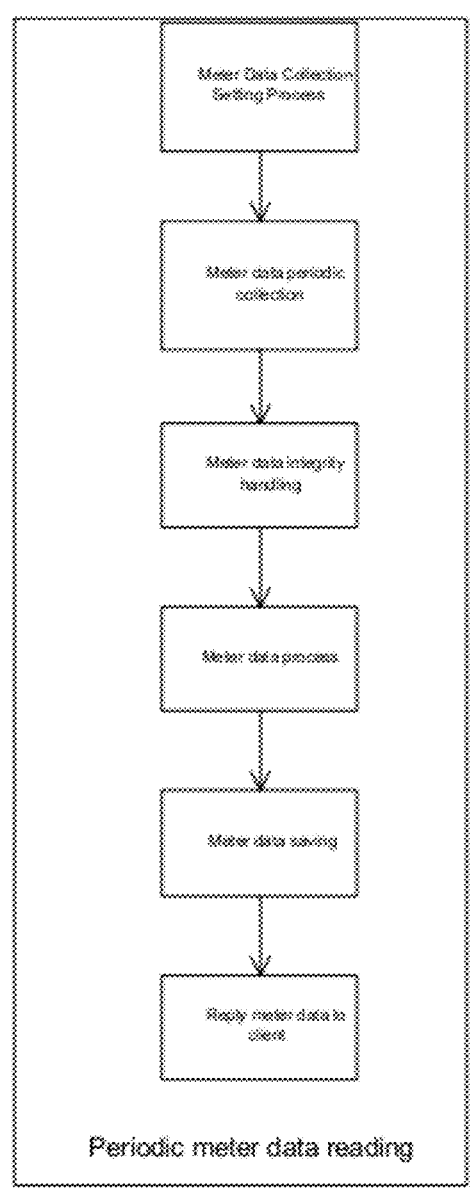
FIG. 6 is a flow chart of an algorithm for reading data by the meter of FIG. 3A.

FIG. 6 shows an embodiment of the meter reading function of head end 118, where basic functions are to set parameters for a collection process, collect data periodically, process data for integrity, process the raw meter data, save meter data and provide the data to the system.

First, NQM 206 in head end 118 sends a request to each meter 116 to obtain data. In doing so, it may send a broadcast message or a multiple messages in parallel to all meters 116 or a group of meters 116 that communicate with gateway 126, to retrieve meter data simultaneously. This timing is facilitated by the network architecture of system 100 and its BPL gateways and by applying a networking protocol combined with an IP switched network support using BPL technology. In one embodiment, the networking protocol used is the SNMP protocol. This network architecture allows retrieval of data from meters 116 at high speeds so as to permit real time monitoring of the meters 116.

An embodiment of system 100 implements data requests and read through network commands sent over the network in system 100. A network read command is implemented by having NQM 206 send a broadcast or multiple messages for data query to the meters 116. The request manager module 302 in each meter 116 will then retrieve appropriate meter data stored in its database for a scheduled data retrieval request or relay the request to platform interface 308 to obtain instant meter data, and then send these data back to NQM 206. NQM 206 receives all meter data and stores the data in a queue and process each retrieve to a standard format and store this information into database 220. NQM 206 also automatically fills in any missing meter readings after a period of network failure or down time of head end 118.

In one embodiment, system 100 collects and stores meter data at periodic intervals (e.g. every 5, 10, 15, 60, 120 minutes or other intervals) from each meter 116 in network. This interval is configurable. The operator can set the data collection interval in head end client 204 of head end 118 (FIG. 2). From there, head end 118 sends updated data collection interval to each meter 116 in the network 100 and stores the data in database 220 as well.

In one embodiment, a profile file in meter 116 is provided. In one embodiment, the profile stores up to approximately 5000 profile entries, stored in the order they are received. In another embodiment, the profile file may also be organized as a circular buffer where once the buffer is full, the oldest entry may be overwritten by the most recent one. For the embodiment with a default interval of 15 minutes, meter 116 can store 52 days worth of data collected from the meter module 130. Changing the data collection interval will increase or decrease the length of time for which a meter can store data. The data may be stored in RAM 312.

Figure 7:
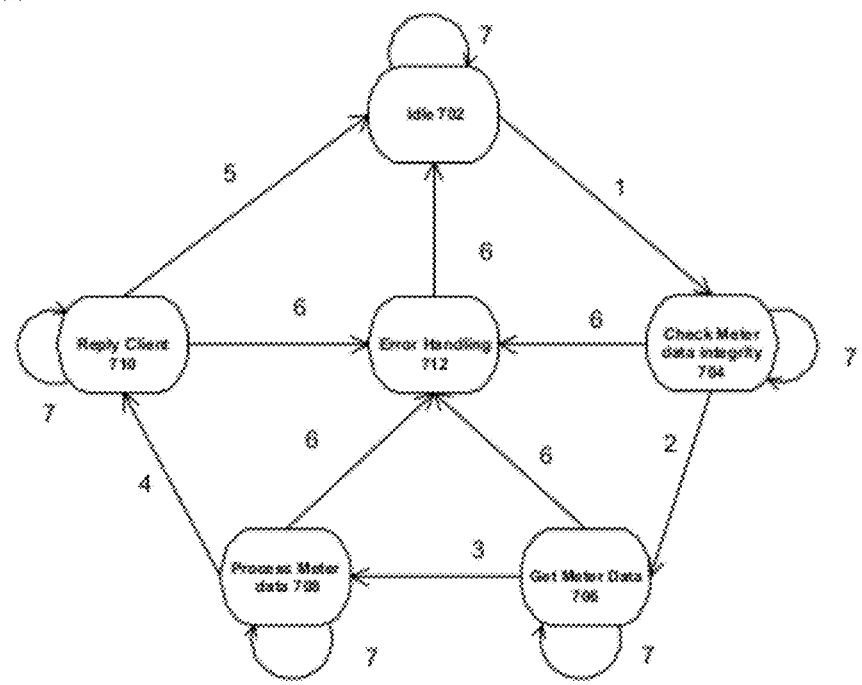
FIG. 7 is a state diagram of the algorithm for meter reading of FIG. 6.

FIG. 7 shows details of state machine 700 provided at head end 118 for managing periodic meter reading of meters 116. In one embodiment, the periodic meter reading module has six states and accepts seven actions, namely:

1. The state machine starts in idle state 702.
2. The state machine stays in idle state 702 until either one of two events happen: the scheduled read at the next time interval is due or the last read data index value is less than the "newest available" index reported by the meter. When either of these events happens, state machine 700 moves to Check Meter Data Integrity state 704.
3. In state 704, head end checks database records for gaps, and retrieves the last read data index for the associated meter. Gaps can be detected because the data index are in sequence. When NQM 206 requests meter 116 to provide data, meter 116 informs NQM 206 of the next sequence number to pull and how many data sequence numbers it contains after the first pulling. In case meter 116 has more than one sequence of data, NQM 206 can recognize that multiple data records from this meter should be expected. Then, it sends a request to change the meter's data-read index pointer to the desired record. The pointer is used to track the sequence number. Finally, it sends a request to meter 116 to retrieve the data record and moves to "Get Meter Data" state 706.
4. The state machine receives the requested data record with the index of the "newest available" record on the meter, which is stored in database 220. The state machine then moves to "Process Meter Data" state 708.
5. In state 708, head end 118 analyzes the retrieved meter data record for integrity and correctness, extracts the data into a format useful to the rest of head end system 118, writes the record to database 220, and updates the last read data index.
6. The state machine moves to the "Reply Client" state 710.
7. The state machine informs head end 118 of the retrieved data, and moves back to Idle state 702, ready to start the meter data collection procedure over again.

This series of states allows head end 118 to automatically retrieve any records it has not yet retrieved due to connection failure, starting with the oldest record first. Doing so maintains a consistent, complete copy of all read meter data at head end 118.

If at any time a state machine spends more than a specified amount of time in a given state, it logs an error and returns to "Idle" state 702. Also, if in any state in state machine 700 encounters an error, (such as malformed or incorrect data), state machine 700 returns to Idle state 702. This ensures that requested data is retrieved, analyzed to be correct, processed and stored.

The periodic meter reading goes through the "Idle", "Check meter date integrity", "Get meter data", "Process meter data", and "Reply client" states to complete a reading task. However, it goes to "Error handling" state 712 if an error event occurred. Using this error handling mechanism ensures that the error or exception does not suspend this functionality. As noted in FIG. 7, actions 1-7 indicate exemplary actions that initiate transitions between states. The states include: 1) Start meter data collection; 2) Start getting meter data; 3) Start processing meter data; 4) Start reply to client; 5) Finish all tasks; 6) Error controls; and 7) Waiting.

Figure 8:
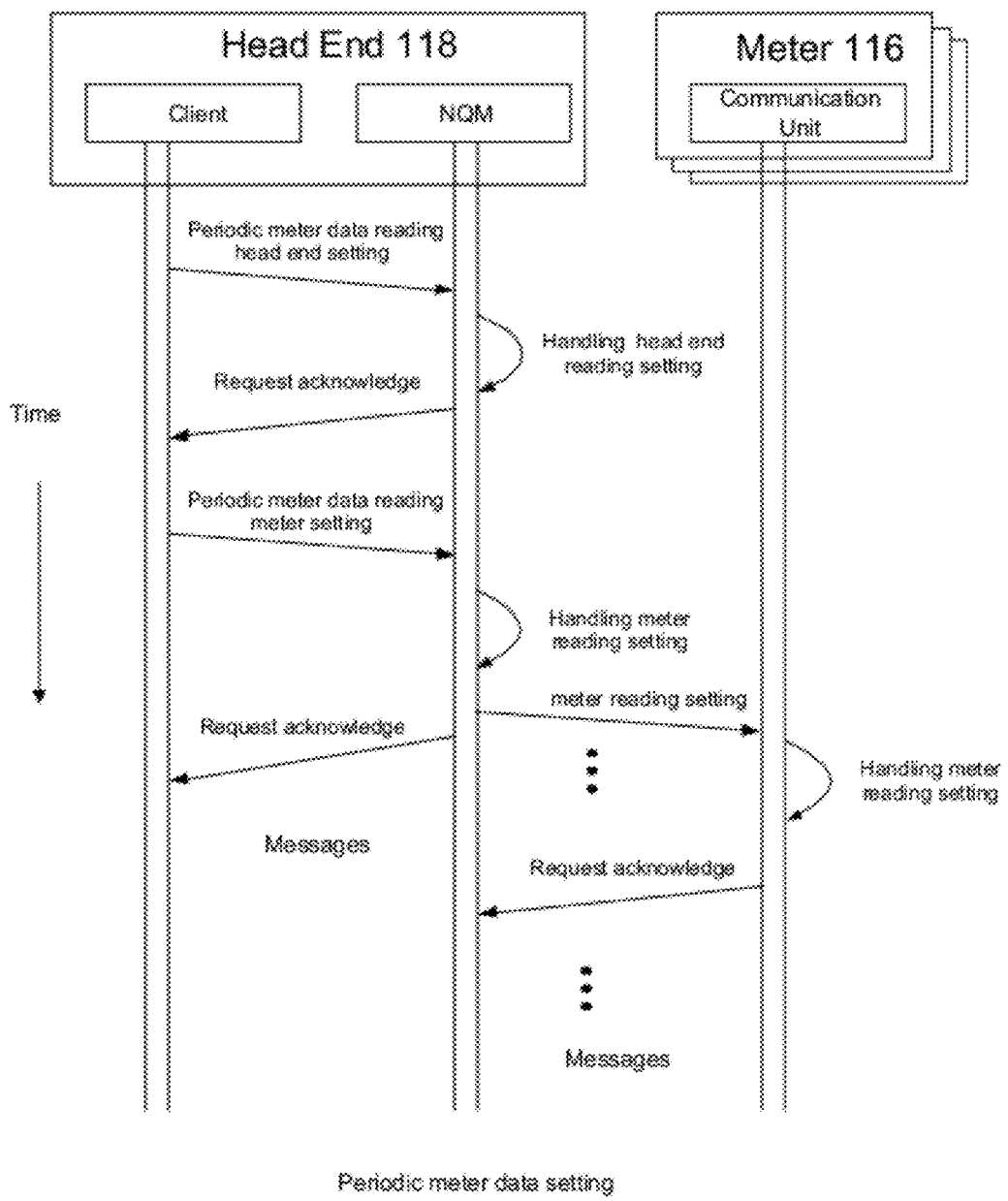
FIG. 8 is a time line diagram of events occurring at the head end and a meter during an exemplary meter reading configuration in the network of FIG. 1A.

Now, further detail is provided in FIG. 8 on a timeline of messages between head end 118 and meters 116 for periodic meter reading configuration setting:

1. The values of meter data periodic reading configuration in head end client 204 are set up.
2. Head end client 204 sends head end configuration values to NQM 206.
3. A communication server processes the request from head end client 204, compared with values of current configuration.
4. If the configuration values are not same as current configuration values, the communication server updates the configuration setting file.
5. Head end client sends meter configuration values to communication server.
6. The communication server sends requests to all meters 116 in system 100 to inform that the configuration settings are updated.
7. Meters 116 update their configuration setting and inform meter module 130.

8. Meters 116 send acknowledges back to communication head end 118.
9. The communication server then sends a reply to head end client 204 after updating the configuration settings.

Each meter 116 is responsible for identifying and tracking the status of its connected device 138. Each meter 116 may establish a local polling parameter/algorithm to request and track data and status updates from its devices 138. Meanwhile NQM 206 may establish a separate polling parameter/algorithm to request and track data and status updates from meters 116. One query may be to first ask a meter 116 whether or not it has data relating to devices 134 (or other status messages) to send. Each meter 116 may collect its relevant data and send a package to head end 118. NQM may receive the data and ask followup requests for more data or confirmation whether the last record was sent. Upon receiving a confirmation from meter 116 that its last record was sent, the polling process may conclude.

Figure 9:
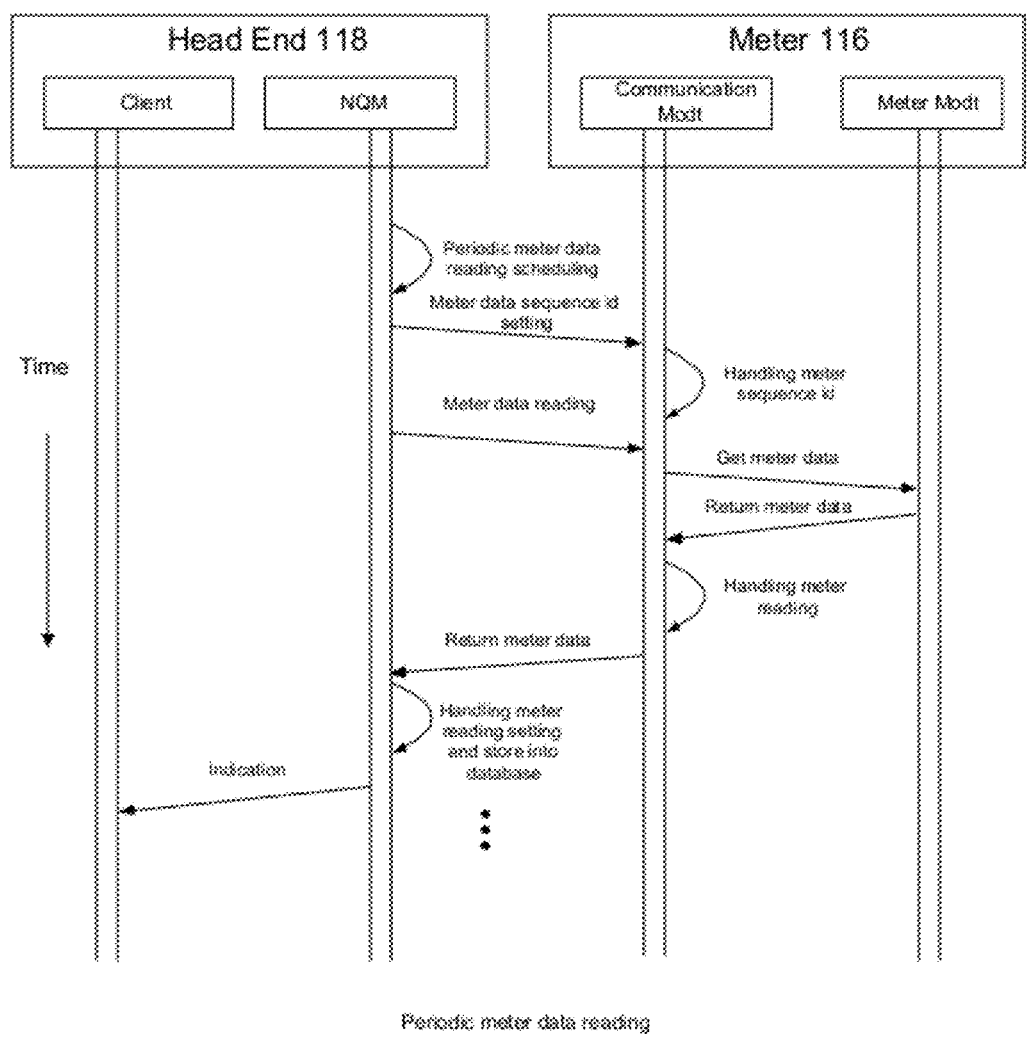
FIG. 9 is another time line diagram of events occurring at the head end and a meter during an exemplary meter reading process in the network of FIG. 1A.

FIG. 9 provides a time line of interactions of head end 118 and meters 116 during a periodic meter reading event:
1. Periodic meter reading schedule is set up in meters 116 according to the configuration setting.
2. When the periodic meter interval timer timeout, the periodic meter reading schedule task is enabled.
3. A communication server gets all topology attributes of meters 116 in network.
4. The communication server verified the data integrity in meters 116.
5. The communication server sends the set request command to meters to set the sequence ID.
6. The communication server sends the read command to meters 116 to read meter data.
7. The communication server analyzes and processes data from meters 116, saves the meter data into a database.
8. The communication server sends response to head end client 204.

In one embodiment, the communication server is NQM 206. The periodic meter request may go through "Idle", "Check meter date integrity", "Get meter data", "Process meter data", and "Reply client" states to complete a reading task. An "Error handling" state is entered if an error event has been detected.

At head end 118, all of the retrieved data is stored in database 220. In one embodiment, up to one year's worth of data is stored in the database for quick access by an operator. With the data for each meter 116, database 220 also stores the last read data index from each meter 116 in the network. Head end 118 maintains a finite-state machine for each meter 116, which ensures that meter data is properly received, checked for integrity, processed and stored.

At meter 116, a table of meter data is stored in flash memory. The data index pointer points to the next row from the table that head end 118 will request to retrieve; head end client 204 first sets this value, and then requests the row at that index. Meter 116 reads data independently of the requests from head end 118. As such, head end 118 can request an arbitrary record of data from meter 116's table. This configuration also allows meter 116 to collect and store data even when connection between meter 116 and head end 118 is lost. Upon re-establishing connection, head end 118 can request the data it is missing, making system 100 highly resistant to data loss.

Figure 10:
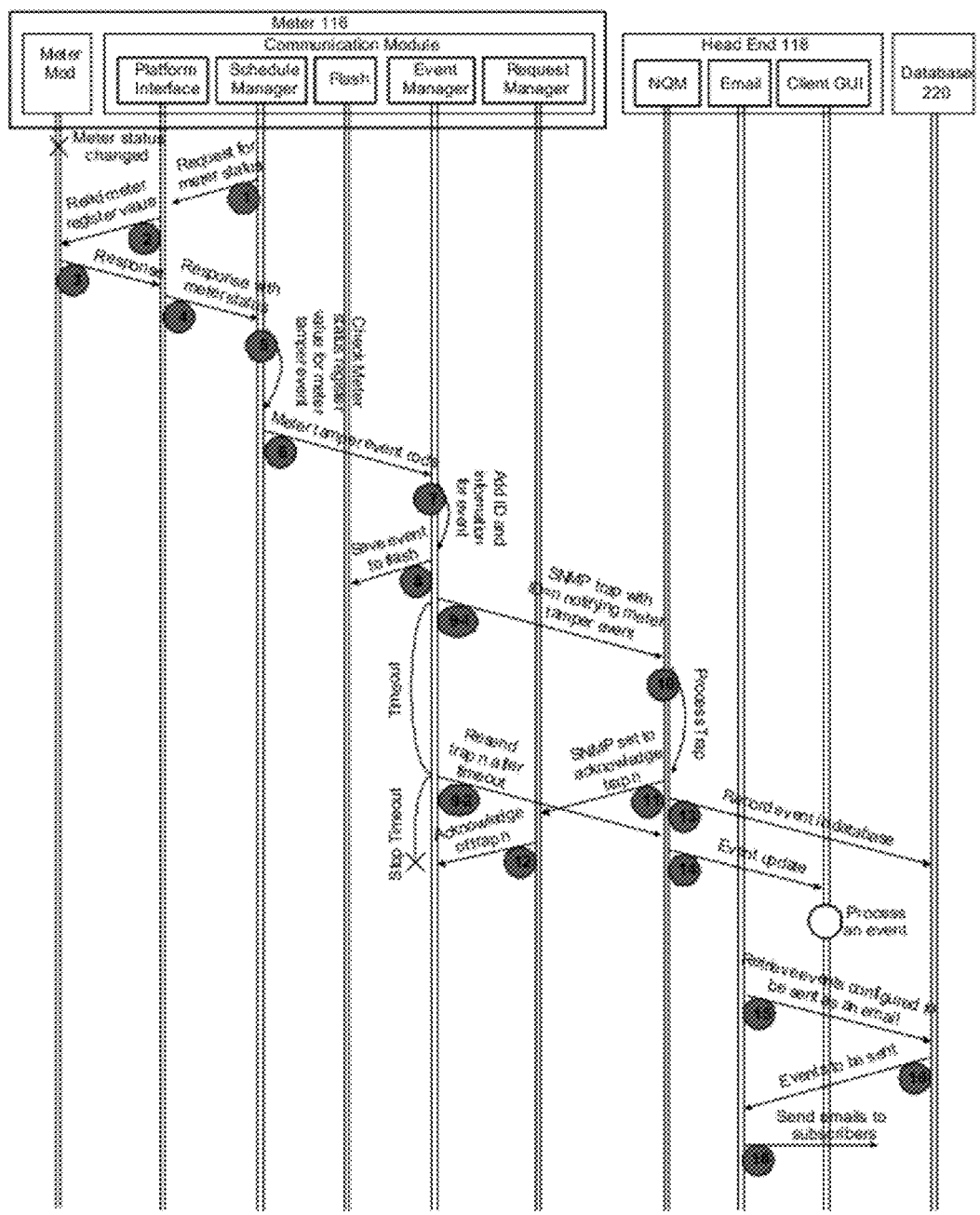
FIG. 10 is another time line diagram of events occurring at the head end and a meter during an exemplary tampering detection process of the meter in the network of FIG. 1A.

FIG. 10 illustrates a time line of real time processing of certain functionalities of an embodiment. The processing functionality involves meter module 130, communication module 128, head end 118 and database 220.

Meter module 130 comprises a meter status register for recording abnormal events that occur in meter 116. In one embodiment, the status register is a two-byte hex code. Each bit of the hex code is used for one particular event. Upon the occurrence of an abnormal event, the corresponding bit of the status register is set. The communication module 130 performs the notification function of the exception event.

Schedule manager module 304 of communication module 128 periodically sends request for meter status to the platform interface 308. Schedule manager module 304 ensures there is priority of the periodic requests of meter status over any other modules in the communication module 128. In one embodiment where a universal asynchronous receiver transmitter (UART) provides the communication module 130. If the UART port is available, schedule manger 304 will lock the UART port to avoid resource competition. Data reads of the meter register value are provided through platform interface 308. A data meter protocol, such as IEC62056-21 is used for encoding meter data. After receiving the response from meter module 130, schedule manager module 304 will unlock UART port to allow use of the port by other modules which may require access to meter module 130.

In one embodiment, the read out registers contain the following values, per Table B:

TABLE B

| Reduced OBIS code | Registers |
| --- | --- |
| C.x.x | Status |
| Reading meter code for channel and rate | Kwh |
| Disconnect code | On or off |
| Power quality register code | V, A, etc |
| Error or sensor data code | Numeric value |

In one embodiment, schedule manager module 304 then examines the register value from the meter module 130 and generates the following events:
1. Meter status event;
   i. Terminal cover removed/closed;
   ii. Strong DC field detected/disappeared;
2. Power quality event;
   i. Voltage drops below the under voltage threshold/voltage returns to normal after under voltage;
   ii. Voltage exceeds the over voltage threshold/voltage returns to normal after over voltage;
   iii. Power outage of each phase/power return of each phase; or
   iv. Current exceeds the over current threshold/current drops below the over current threshold.

The meter status event is generated based on the status register. If a bit of the status register changes (which means the meter status changes), schedule manager module 304 will check the bit mapping and generate the corresponding event.

For every phase, several configurable voltage levels are monitored, such as an over voltage threshold, an under voltage threshold, and a missing voltage threshold. If the read-out line voltage exceeds or drops below a given threshold, schedule manger 304 will generate an event report. In one embodiment, to avoid unnecessary generation of events due to disturbances or very short voltage dips, a delay mechanism is in place for voltage monitors. In another embodiment for current monitoring, the over current threshold is monitored.

For each type of event has a unique event code pre-defined for it. When schedule manager module 304 detects the abnormal status of meter module 130, it will immediately send a message with event code information to event manager module 306.

Event manager module 306 is in charge of adding more information to the event message, saving important events to flash memory and also sending the event message to head end 118. In one embodiment, the event message is sent as a SNMP trap.

Information that may be added by event manager module 306 include an identification (ID) tag, timestamp, and flag to the event message whereby:

1. The ID is used to identify events and will also be used by head end 118 for event acknowledgement.
2. The timestamp indicates the event occurred time.
3. The flag indicates if the timestamp of event is valid or not. This flag is set as invalid if communication module 128 failed to synchronize its time with NTP server 216. In this situation, the timestamp in event message will be an estimated system time.

To ensure important events can be recovered after manual power cycle or power outage, those events that are not acknowledged by head end 118 will be saved to the flash memory of meter 116. This mechanism allows event manager module 306 to provide notification for all events when meter 116 powers on again. In one embodiment, because the lifetime of a flash memory is related to the flash reading and writing times, event manager module 306 may use a method to records events into different part of a flash to extend the lifetime of the flash memory.

After saving events into flash memory, event manager module 306 will generate a message with all the event information as variable bindings and send the message to head end 118. In one embodiment, the message sent by event manager module 306 is a SNMP trap. Upon receiving the message, NQM 206 in head end 118 will send an acknowledgement by using SNMP set message to the event manager module 306 through request manager module 302 in communication module 128 of meter 116. The acknowledgement contains the identification code of the event. If event manager does not receive the acknowledgement of an event, this event may be resent after timeout. This resend mechanism ensures that every event is received by head end 118 so as to provide notification to the system operator.

In one embodiment, in addition to sending the acknowledgment, NQM 206 also checks if the meter event is configured as monitored, records event in the centralized database server 220, and gives a signal to the graphical user interface for head end client 220 to trigger an event display update for all log-in users. There are two configured flags for each event type in head end 118: one indicates if this type of event should be monitored; and the other indicates if the type of event should be notified by using communication methods such as emails, instant messaging, SMS, or any other rapid messaging methods. For the event type that is marked as monitored by an operator of head end 118, NQM 206 will continue to process it. Otherwise, NQM 206 may just ignore it. This function provides the flexibility to allow configuration where only specific events are monitored and displayed.

In one embodiment of the head end 118, the following event entries are found in database 220 for each event, per Table C:

TABLE C

| Field | Description |
| --- | --- |
| Number | A automatically increased number for this table |
| Event ID | The meter event ID |
| Event code | The meter event type |
| Event source | The meter Utility ID |

TABLE C-continued

| Field | Description |
| --- | --- |
| Timestamp | The time when this meter event occurred |
| Notified status | Indicate if this event has been sent as E-mail |
| Owner | The operator who takes the ownership of this meter event |
| Status | Pending: this process is waiting to be processed<br>Processing: this event is under investigation<br>Processed: this event is processed<br>Closed: this event is verified as solved |
| History | Record the below information every time the event status is changed<br>*the operation time<br>*operator |
| Information | Other information |

NQM 206 is responsible for inserting one entry with the information retrieved from SNMP trap variable binding such as event ID, Event Code, Event Source and timestamp into database. Other fields of an event entry are used for event management.

When head end client 204 receives an event update from NQM 206, all operators at head end 118 can see it and start to work on the event. If an operator taking the ownership of a meter event, other operators will be able to see this information by the owner field to avoid conflict. The status field of an event allows clear and easy management of the progress of the event. The operation history of one event is recorded in head end 118 for future reference.

In one embodiment of head end 118 is a module called "email" which retrieves non-notified meter events from database 220 periodically. For these non-notified meter events, the email module will compose emails with event code, event source, and timestamp information and send the emails out to all subscribers and then the notified status of that event entry will be updated by the email module to indicate event notified successfully.

The periodic and real time event based processing features of system 100 allows significant control over individual meters 116 and allows faster response by system 100 and its operators in the event of localized or system wide problems.

Another feature of system 100 provides a clock synchronization feature between meters 116 and head end 118.

In this embodiment, meter 116 does not have a battery to maintain its internal clock during power outage. An AC regular capacitor provides the power reserve for only 1 second in event of power outage, and meter 116 loses its internal clock if the power outage lasts longer than 1 second. As such, in one embodiment, meter module 130 does not have (or does not use) a calendar clock. The communication module 128 is, therefore, responsible for all the time-stamped related functions of meter 116. Communication module 128 synchronizes its calendar clock with NTP server 216 periodically and upon power restoration. The IP address of NTP server 216 is stored in RAM 322 of communication module 128, and can be configured by head end 118, including through standard SNMP Set command.

When meter 116 initially boots up, communication module 128 tries to synchronize its clock with NTP server 216. If it fails to synchronize its clock with NTP server 216, it will enable the clock synchronization task.

Figure 11:
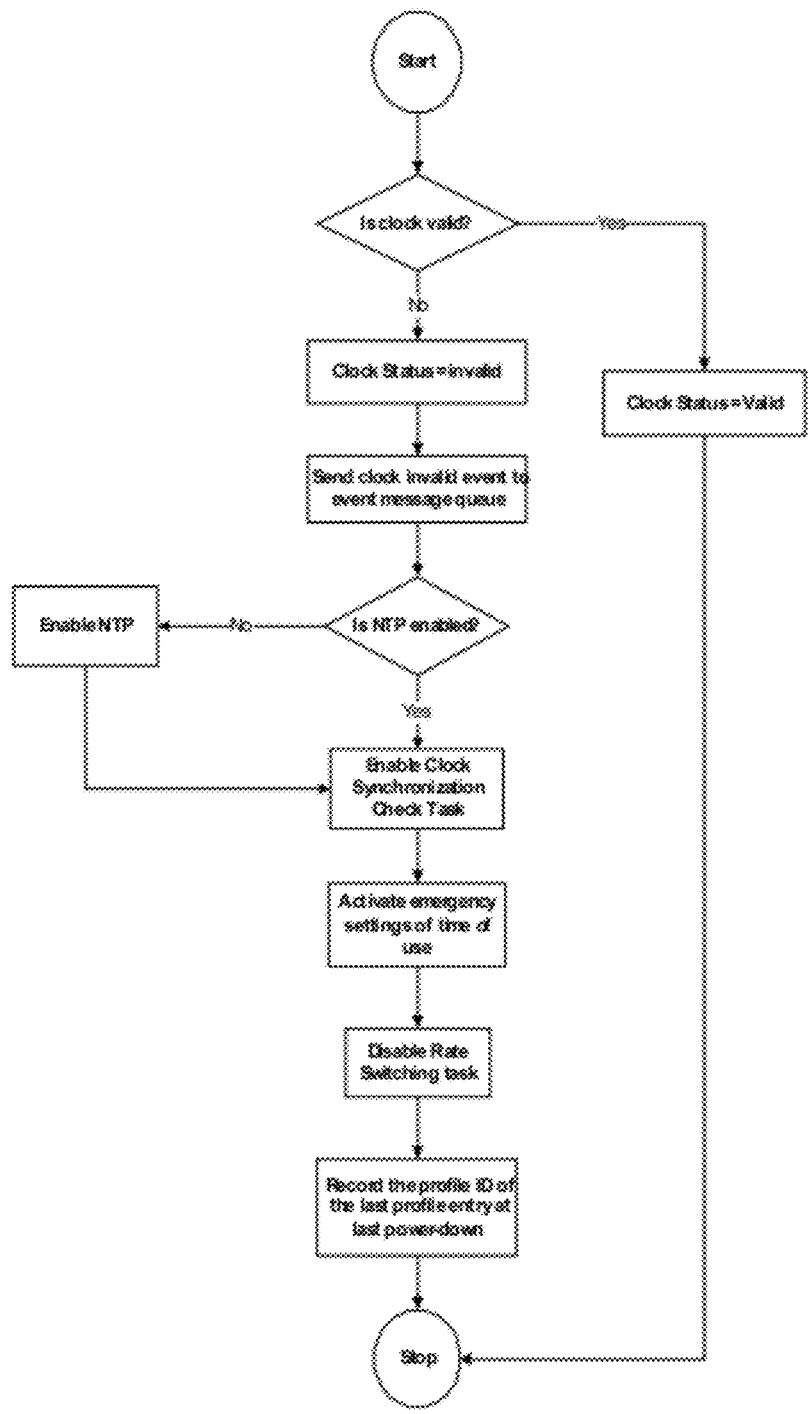
FIG. 11 is a flow chart showing a synchronization algorithm used by the meter of FIG. 3A.

FIG. 11 illustrates a procedure used by communication module 128 to determine whether to enable the clock synchronization task at boot-up.

Communication module 128 checks the clock status of the meter module 130 on boot-up, once an invalid clock status is found, it will do the following actions in order:

1. Initiates a clock status invalid message, and then push the message to event message queue.
2. Check if NTP client is enabled, if not, enable it.
3. After NTP client has been enabled, start a clock synchronization task to synchronize clock periodically.
4. Activate emergency setting for time of use.
5. Disable the rate switching task until clock status has been changed to valid.
6. Make a recode of the profile ID for the last profile entry at last power down.

Figure 12:
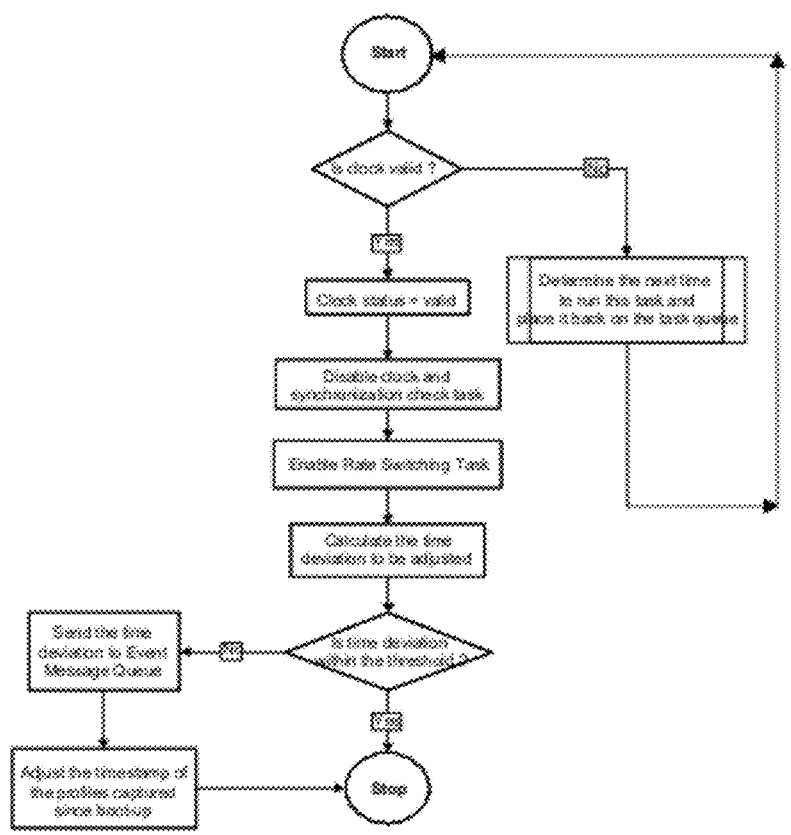
FIG. 12 is a flow chart showing a clock synchronization algorithm used in the meter of FIG. 3A.

FIG. 12 further illustrates the execution of clock synchronization check task as described in step 3 of FIG. 11.

Upon communication module 128 successfully synchronizing its clock with server 220, the following actions are executed:
1. Clock synchronization task is disabled
2. Rate switching task is enabled.
3. calculate the time difference between the synchronized time and unsynchronized time (time deviation=the synchronized time−(the time recorded at last power-down+ the time elapsed since boot-up).
4. If the time deviation exceeds certain threshold, communication module 128 initiates a message with the time deviation, and then pushes the message to event message queue.
5. The timestamps of all profile entries that were captured since boot-up are adjusted by the time deviation.

In the event of a power down, communication module 128 stores the current clock in RAM 322 immediately. When power is restored, before the meter synchronizes the clock with NTP server 216, the following actions are executed:
1. The clock of the meter is calculated as follows: the time recorded at last power-down+the time elapsed since boot-up.
2. A "clock invalid" bit of the module status is set. It remains active until the clock is synchronized.
3. All time stamps that occur before the meter synchronizes with server 220, are marked as invalid.

The clock synchronization mechanism as implemented in system 100 reduces the impact of any power outages to data collection and system management by head end 118.

Now further detail is provided on network analysis features for an embodiment.

System 100 further monitors operating conditions of networks 108 and 110. Exemplary monitored conditions include signal to noise ratio ("SNR") and channel frequency response ("CFR") monitoring for power signals carried in networks 108 and 110, as detected at meter 116. SNR measures of how much a (power) signal has been corrupted by noise and is defined by the ratio of signal power to detected noise power which disrupting the signal. CFR is a measure of each carrier's sensitivity levels. It is defined by a gain factor which controls the sensitivity of a receiver system.

In one embodiment, data is modulated on transmission lines in networks 108 and 110 using data division/carrier techniques using different frequency bands to define includes multiple carriers. One transmission technology used is Orthogonal Frequency Division Multiplexing (OFDM), which transmits parts of a transmission in a sub channel of a selected carrier. A transmission line carries data modulated over a bandwidth of frequencies. For effective bandwidth use, the available bandwidth is segmented into a series of carriers. Each carrier can then carry all or part of a transmission.

In one transmission protocol, when transmitting a message, head end 118 may divide the signal relating to the message in multiple segments and then transmit each segment on a defined, different frequency range (as a channel) over the available frequency range. At the receiving end, meter 116 may extract each message from each channel to reconstitute the original message and then process same. Similarly, when meter 116 transmits a message to head end 118, it may divide the signal relating to that message in multiple segments and then transmit each segment on a defined, different frequency range (as a channel) over the available frequency range back to head end 118. In order to prevent communication conflicts between messages sent downstream from head end 118 to meters 116 and messages sent upstream from meters 116 to head end 118 over a given transmission line in networks 108 and 110, an embodiment may allocate certain segments of time in a repeating cycle for transmission of downstream from head end 118 and other segments in the cycle for upstream transmissions. One embodiment provides 1536 carriers for LV and MV networks 110 and 108.

It has been determined that at a given point in system 100, an analysis can be conducted for signals carried therein. By measuring certain electrical signals (e.g. voltage, current) at given time intervals over certain frequency ranges, the electrical signals of messages being carried in system 100 can be measured. Depending on the time of the measurement and messaging timing protocols for system 100, the detected signals can represent downstream or upstream messages. Measurements can be taken at head end 118, meter 116 or points inbetween. At any given measurement point, notional downstream and upstream messages in a normally operating network environment may be expected to have average measured signals of certain values.

Two types of measurements are provided by an embodiment.

SNR is a relative comparative value measuring the quality of a signal to a noise floor. SNR is determined for a particular carrier by measuring a power signal at a location (e.g. meter 116) and dividing it by a noise signal detected at that location. The noise signal represents part of a destructive radio frequency wave in the transmission. The noise may be in the ambient environment in which that the signal is carried.

CFR is an absolute value measuring the strength of a signal. CFR is determined by measuring a power signal at a location (e.g. meter 116).

As noted, measurements may be taken at any point in system 100. Measurements taken at head end 118 may be analyzed by head end 118. For measurements taken at elements downstream to head end 118 (e.g. meter 116), the data for the measurements may be provided to head end 118 via a message constructed and sent at the measuring location.

It has been discovered that SNR and CFR are useful data transmission performance indicators of and networks 108 and 110 for system 100. SNR and CFR values that tend to decrease (i.e. smaller ratios) indicate a physical degradation of the underlying electrical medium (namely the power line in one or both of networks 108 and/or 110).

System 100 addresses several challenges in providing BPL. Some of the technical issues that an embodiment may need to overcome include:
1. Power line cables networks were not originally designed to carry other data signals.
2. Characteristic impedance is unknown and not controlled along the power lines.
3. Power line network topology is unknown and not controlled.
4. In general, noise levels in power lines depend on the external sources and environments.
5. Power line network throughput is very sensitive to noise level. SNR and CFR monitoring features are described in two sections: SNR and CFR data collection configuration and performance reports.

As such, in an embodiment, SNR/CFR monitoring and reporting provides one or more of the following features:
1. Determine the optimal frequency band and signal injection location during deployment phase;
2. Utilize broadband power line communications and retrieve real time SNR, CFR data to analyze power line health and trends;
3. Analyze and distill SNR/CFR data in a GUI for an operator at head end 118;
4. Provide proactive diagnostics operation; and/or
5. Maintain phase to reduce electricity grid cable and/or component failure.

Figure 13:
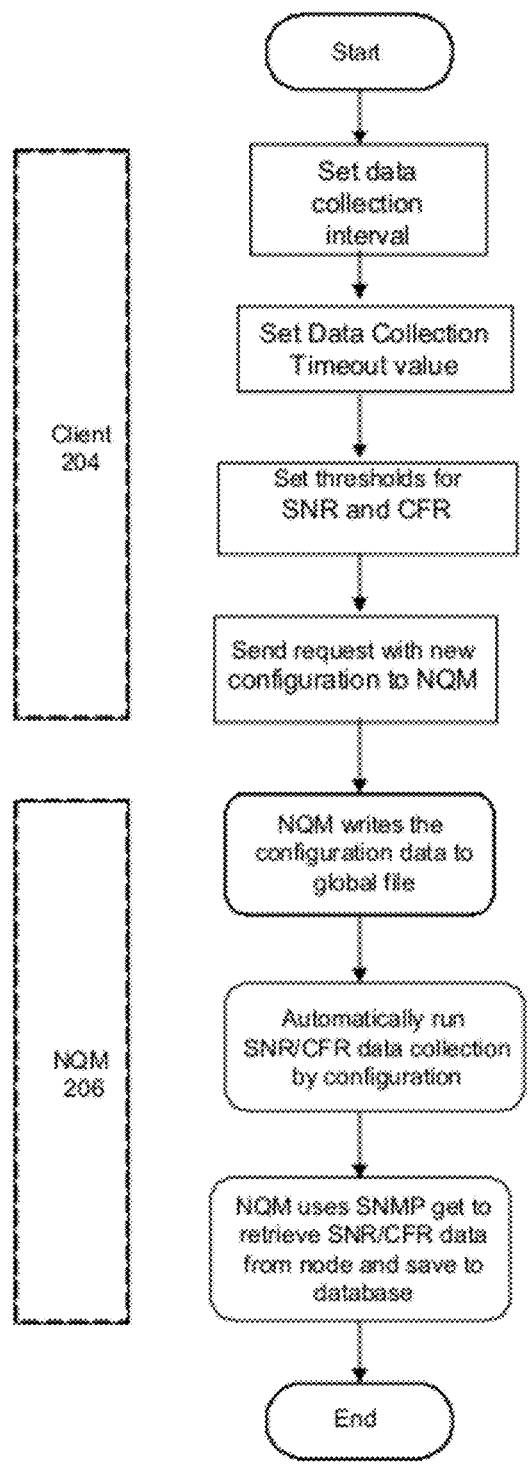
FIG. 13 is a flow chart showing a signal measurement algorithm used to detect condition in the network of FIG. 3A.

FIG. 13 illustrates SNR/CFR data collection configuration procedures, completed through head end 118, NQM 206, and communication module 128 of meter 116. Configuration processes are started from head end 118. Head end 118, through its head end client 204, allows a user to select the interval of SNR/CFR data collection, retry times and time out value. Upon selection of the intervals and other data collection requirements, a request with new configuration is sent from head end 118 to meters 116. In one embodiment, the request with new configuration settings are received by NQM 206 from head end client 206 through socket connection wrapped in a Qxt framework (trade-mark).

NQM 206 is responsible for writing new settings into a configuration file, which in one embodiment, is shared by applicable modules of head end 118, NQM 206, configuration manager 208, event manager 210, and information request manager ("IRM") 212. In other embodiments, the settings files are separate and are written for each module.

Based on the configuration settings, NQM 206 automatically runs SNR/CFR data collection routines through head end 118 to retrieve data from communication module 128 of meter 116.

Communication module 128 utilizes data collection algorithms to generate SNR and CFR data. SNR data is calculated the ratio of signal and noise of a carrier. The data may be provided to head end 118 a long row data string. The string may use SNMP object identifiers to get by NQM 206 from communication module 130 and then saved into database 220 server at head end 118. The SNR string can be retrieved from database 220 by head end client 204 and converted to a signal level and graphically represented in the graphical user interfaces in format of charts, tables, or other visual formats.

FIG. 14 shows one embodiment of the configurability of, SNR and CFR data collection on client GUI for head end 118. Head end 118 allows users to can initiate various commands using a GUI at head end client 204, including any of the following:
1. From which subnets to collect SNR and CFR data. The system will collect SNR and CFR data from all the devices belonging to the selected subnets in its BPL networks;
2. Frequency of data collection for SNR and CFR data under normal situations;
3. Setting thresholds of SNR and CFR; and/or
4. Identifying actions to perform in the event of threshold violations.

The available actions include:
1. Send a communication to notice the network administrator;
2. Change the SNR and CFR data collection interval; or
3. Start data collection on other performance measurements.

In addition to providing data polling for operating conditions of power lines in networks 108 and/or 110, head end 118 allows a network administrator to determine other problems in networks of system 100.

Figure 16:
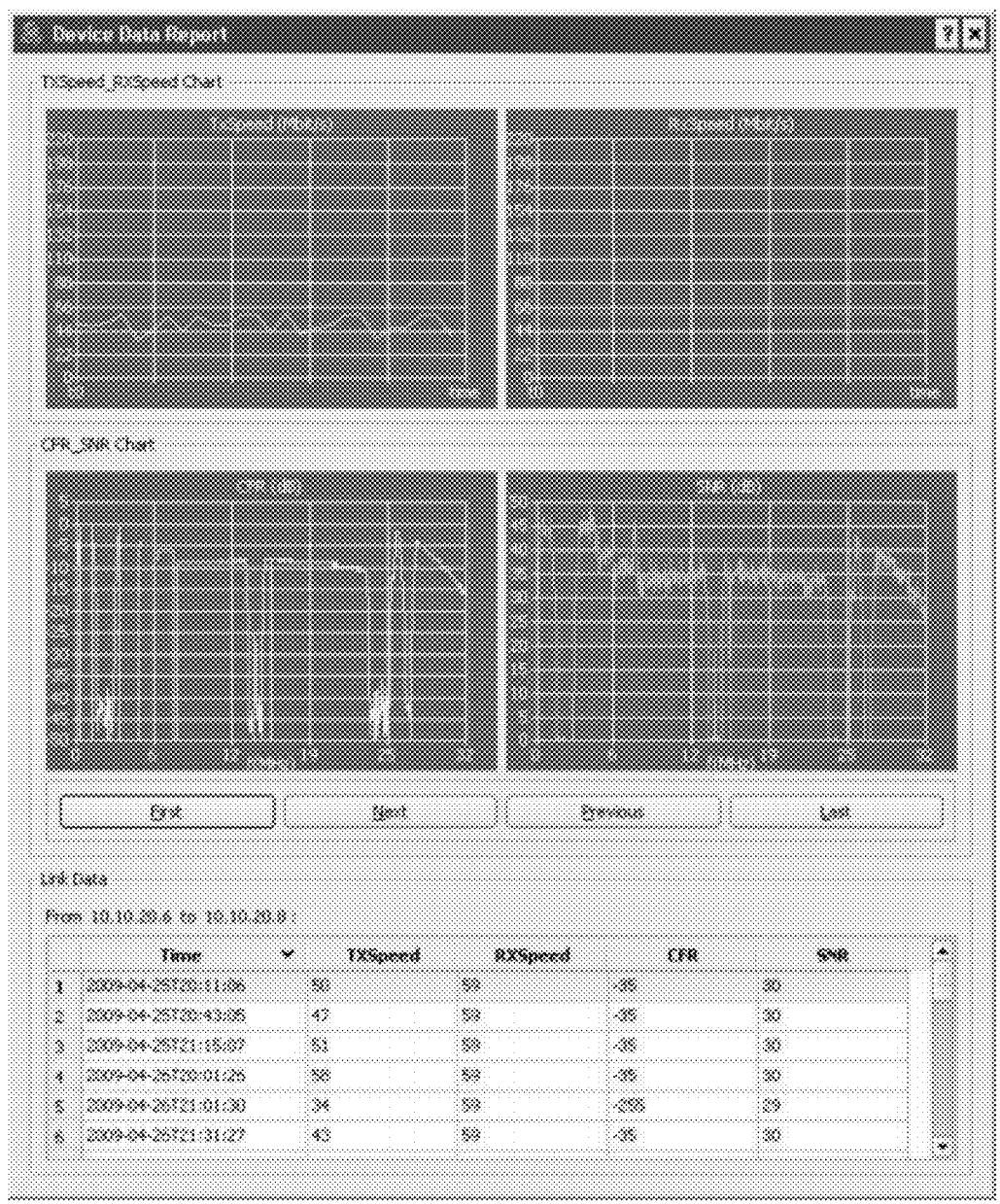
FIG. 16 is a snapshot of a performance GUI generated on a display of a client associated with the head end of FIG. 3A.

FIG. 15 illustrates one embodiment whereby the user may select SNR/CFR data by link between slave node and master peer. The SNR/CFR data may be displayed in various styles, including two or three dimensional styles. In one embodiment as illustrated in FIG. 16, the SNR and CFR data is displayed in a raw table view where the network administrator can click on any row in the table view to see the chart of SNR and CFR data at corresponding timeline. The GUI for head end client 204 may provide navigation buttons for user to go through the historical data of SNR and CFR and watch the change of real data and chart display. The changes of SNR/CFR assist in predicting future trends.

Figure 17:
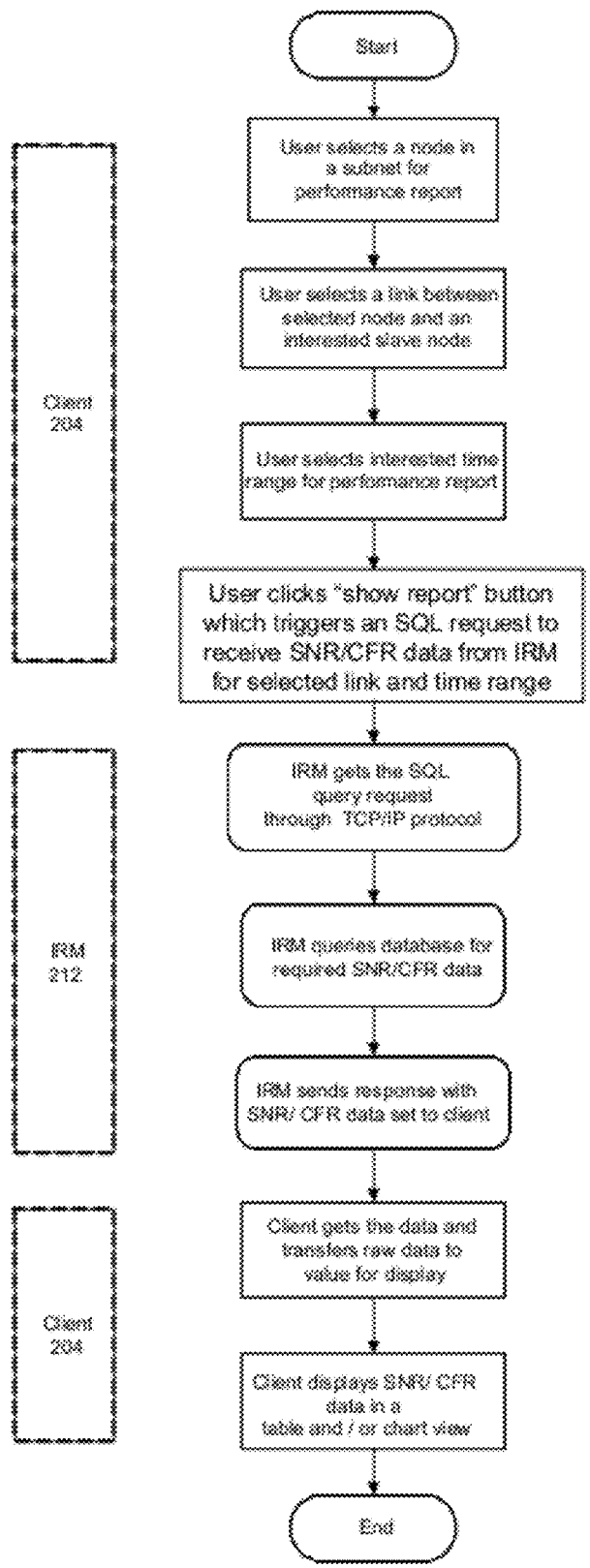
FIG. 17 is a flow chart showing a data collection/analysis algorithm executed at a client associated with the head end of FIG. 3A.

FIG. 17 illustrates exemplary processes steps involved in one embodiment for predicting trends of characteristics of system 100. The processes involve head end client 204 and IRM 212.

After a user select some node and interested link, set up the time range, and send a request to query SNR/CFR data. A request will through socket connection between head end client 204 and IRM 212. IRM 212 will query database 220 with received the query request. Then, a data set of SNR and CFR is sent back to head end client 204 if the data query is successfully. For the data fetch from the database 220 is row data, head end client 204 needs to transfer those data into database 220 and frequency and visualized in two dimension styles with time stamp.

The SNR and CFR measurement directly correspond to physical line characteristic changes. The rate of change in SNR and CFR values may be measured and used to predict line failures. For example, before a line or equipment on the power line fails, it often emits sparks. These sparks can be reflected in SNR and CFR to up and down fluctuations. By measuring the change of SNR and CFR, an embodiment can monitor received power signals and set threshold values to indicate a potential failure condition. Trends and changes can be determined from comparing "base line" values against detected values. Intermittent spikes and progressions can be identified over a series of measurements. An intermittent spike (either above or below average thresholds at certain time instances) may indicate noise or may indicate a specific type of failure. Similarly, trends may indicate another failure or condition.

As such, the SNR and CFR data collection features and line characteristic prediction/detection mechanism of this embodiment of system 100 provides a system that is able to monitor and regulate not only electrical transmission but detection of problems within the transmission line. Such detection allows a power supplier to determine beforehand possible failures of a transmission line and to fix any problems in such line to avoid wide scale power outages.

In this disclosure, where a threshold or measured value is provided as an approximate value (for example, when the threshold is qualified with the word "about"), a range of values will be understood to be valid for that value. For example, for a threshold stated as an approximate value, a range of about 25% larger and 25% smaller than the stated value may be used. Thresholds, values, measurements and dimensions of features are illustrative of embodiments and are not limiting unless noted. Further, as an example, a "sufficient" match with a given threshold may be a value that is within the provided threshold, having regard to the approximate value applicable to the threshold and the understood range of values (over and under) that may be applied for that threshold.

It will be appreciated that the embodiments relating to circuits, algorithms, devices, modules, networks and systems may be implemented in a combination of electronic circuits, hardware, firmware and software. Firmware, software, applications and modules may be provided in executable software code that is stored in a physical storage device and executed on a processor of a device. The circuits may be implemented in whole or in part through a combination of analog and/or digital components. In a circuit, an element may be connected to another element either directly or through another circuit. When a first element is identified as being connected to another element, that first element itself may be considered to be a "circuit". The firmware and software may be implemented as a series of processes, applications and/or modules that provide the functionalities described herein. The algorithms and processes described herein may be executed in different order(s). Interrupt routines may be used. Data may be stored in volatile and non-volatile devices described herein and may be updated by the hardware, firmware and/or software.

It will further be appreciated that all processes, algorithms, steps etc. as described herein may be conducted in a single entity. For example the calculations for the first and/or second stages may be provided in the device itself. Such calculations may be conducted by one or more modules in the device. The disclosure as such provides a method of operating a device and/or a method for a function operating on the device. Alternatively, such calculations may be conducted in an off-site location (e.g. a design laboratory) and the resulting circuits and calculations can be provided to the device.

The present disclosure is defined by the claims appended hereto, with the foregoing description being merely illustrative of embodiments of the disclosure. Those of ordinary skill may envisage certain modifications to the foregoing embodiments which, although not explicitly discussed herein, do not depart from the scope of the disclosure, as defined by the appended claims.

The invention claimed is:

1. A meter for monitoring usage of power provided by a power transmission system to a site, the meter comprising:
   a communication module to generate communications carried over the power transmission system;
   a relay having a first position where power from the power transmission system is connected to the site and a second position where the power is disconnected from the site;
   a request manager module to process messages received through the communication module from a head end associated with the power transmission system;
   a meter module connected to a power feed associated with the power transmission system to provide readings relating to the power used at the site;
   a schedule manager module to generate a control signal to provide a fraction of the power to the site; and
   a connection manager module
      to evaluate the readings and data relating to past power usage at the site and generate connection signals for the relay for the meter to the power transmission system in view of the readings;
      to evaluate the readings and control the schedule manager in generating the control signal; and
      to generate a signal for the relay to disconnect the power when a condition in the power transmission system has been detected by or reported to the meter.

2. The meter for monitoring usage of power as claimed in claim 1, wherein:
   the condition is an over-voltage condition over a threshold over a period of time.

3. The meter for monitoring usage of power as claimed in claim 2, wherein:
   the threshold of voltage value is provided to the meter from a message received through the power transmission system.

4. The meter for monitoring usage of power as claimed in claim 1, wherein:
   the connection manager module generates a second signal for the relay to connect the power to the site when a reset condition has been detected by the meter module.

5. The meter for monitoring usage of power as claimed in claim 1, wherein:
   the connection manager module also generates a second signal for the relay to connect-the power to the site when a disconnect condition has been detected by the meter module.

6. The meter for monitoring usage of power as claimed in claim 1, further comprising:
   an event manager module to evaluate new events queued in a message queue received by the meter.

7. The meter for monitoring usage of power as claimed in claim 1, wherein the schedule manager module further:
   obtains a plurality of readings from the meter module and provides results of the plurality of readings to the connection manager module.

8. The meter for monitoring usage of power as claimed in claim 7, wherein:
   the plurality of readings is made according to a schedule provided by the schedule manager module.

9. The meter for monitoring usage of power as claimed in claim 7, wherein the schedule manager module:
   updates a usage rate for readings made by the meter module.

10. The meter for monitoring usage of power as claimed in claim 1, wherein:
    the request manager module processes a broadcast message received from the head end of the power transmission system relating to a cluster command for meters in a subnet that include the meter.

11. The meter for monitoring usage of power as claimed in claim 7, wherein the schedule manager module:
    synchronizes a clock of the meter with a system time managed at the head end of the power transmission system.

12. The meter for monitoring usage of power as claimed in claim 1, wherein:
    the condition is detection at least one of opening a case of the meter and disconnection of the meter from the power.

13. The meter for monitoring usage of power as claimed in claim 1, wherein the connection manager module further:
    generates the signal for the relay after receiving a disconnect signal from the head end of the power transmission system.

14. A method for monitoring usage of power provided by a power transmission system to a site through a meter, the method comprising:
    obtaining and storing readings for a power feed associated with the site;
    evaluating the readings and data relating to past power usage at the site;
    generating connection signals for the meter to the power transmission system in view of the readings;

controlling a relay having a first position where the power is connected to the site and a second position where the power is disconnected from the site when an over-voltage condition on the power transmission system has been detected by or reported to the meter; and evaluating the readings and control a schedule manager to generate a control signal to provide a fraction of the power to the site.

15. The method for monitoring usage of power provided by a power transmission system to a site through a meter as claimed in claim 14, further comprising:

generating a connection signal to connect the power to the site when a reset condition has been detected.

16. The method for monitoring usage of power provided by a power transmission system to a site through a meter as claimed in claim 14, wherein:

the relay is also set to the second position when at least one of opening a case of the meter and disconnection of the meter from the power is detected.

17. A meter for monitoring usage of power provided by a power transmission system to a site, the meter comprising:

a communication module to generate communications carried over the power transmission system;

a relay having a first position where power from the power transmission system is connected to the site and a second position where the power is disconnected from the site;

a request manager module to process messages received through the communication module from a head end associated with the power transmission system;

a meter module connected to a power feed associated with the power transmission system to provide readings relating to the power used at the site;

a schedule manager module to generate a control signal to provide a fraction of the power to the site; and a connection manager module to evaluate the readings and data relating to past power usage at the site and generate connection signals for the relay for the meter to the power transmission system in view of the readings;

to evaluate the readings and control the schedule manager in generating the control signal; and to generate a signal for the relay to disconnect the power upon detection of when at least one of opening a case of the meter and disconnection of the meter from the power.

\* \* \* \* \*